United States Patent
Murade

(10) Patent No.: US 6,433,767 B1
(45) Date of Patent: Aug. 13, 2002

(54) ELECTROOPTICAL APPARATUS, METHOD OF PRODUCING THE SAME AND ELECTRONIC APPARATUS

(75) Inventor: Masao Murade, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/240,888

(22) Filed: Feb. 1, 1999

(30) Foreign Application Priority Data

Jan. 30, 1998 (JP) ............................................. 10-020002
Aug. 3, 1998 (JP) ............................................. 10-219433
Sep. 25, 1998 (JP) ............................................. 10-272118

(51) Int. Cl.$^7$ ................................................. G09G 3/36
(52) U.S. Cl. ............................... 345/92; 345/87; 345/90
(58) Field of Search ........................... 345/90, 92, 100, 345/93, 94, 58; 349/43, 138, 113, 110

(56) References Cited

U.S. PATENT DOCUMENTS

| | | | |
|---|---|---|---|
| 5,631,753 A | | 5/1997 | Hamaguchi et al. |
| 5,641,974 A | | 6/1997 | de Boer et al. |
| 5,801,673 A | * | 9/1998 | Shimada et al. ............ 345/100 |
| 5,808,595 A | * | 9/1998 | Kubota et al. ............... 345/92 |
| 5,877,830 A | * | 3/1999 | Shimada et al. ............ 349/113 |
| 5,907,313 A | * | 5/1999 | Kubota et al. .............. 345/100 |
| 6,055,034 A | * | 4/2000 | Zhang et al. ............... 349/151 |
| 6,137,552 A | * | 10/2000 | Yanai ......................... 349/44 |
| 6,175,395 B1 | * | 1/2001 | Yamazaki et al. ........... 349/44 |

* cited by examiner

*Primary Examiner*—Chanh Nguyen
*Assistant Examiner*—Fritz Alphonse
(74) *Attorney, Agent, or Firm*—Oliff & Berridge PLC

(57) ABSTRACT

The invention provides an electrooptical apparatus, such as a liquid crystal apparatus, including a built-in-peripheral circuit in which the resistance of input/output wirings in the peripheral circuit is reduced by effectively using thin films forming pixels, thereby making it possible to display a high-quality image. The liquid crystal apparatus includes a liquid crystal layer disposed between a pair of substrates and pixel electrodes formed in a matrix fashion on a TFT array substrate. A light blocking film made of refractory metal is provided under TFTs of respective pixels, scanning lines, and capacitance lines. There are also provided peripheral wirings, such as image signal lines including second wiring made of the same metal film as that of the data lines and also including first wiring whose layers are conductive film as that of the light blocking film and the same polysilicon film as that of the scanning lines, respectively.

21 Claims, 16 Drawing Sheets

ELECTROOPTICAL APPARATUS, METHOD OF PRODUCING THE SAME AND ELECTRONIC APPARATUS

BACKGROUND OF THE INVENTION

1. Field of the Invention

The present invention relates to an electrooptical apparatus such as an active matrix liquid crystal apparatus driven by thin-film transistors (hereinafter also referred to as TFTs), and also to a method of producing such an electrooptical apparatus. More particularly, the present invention relates to an electrooptical apparatus such as a liquid crystal apparatus suitable for use in a liquid crystal projector, and including peripheral circuits such as a data line driving circuit and a scanning line driving circuit, wherein a light blocking film is disposed under each TFT. The present invention further relates to a method of producing such an electrooptical apparatus.

2. Description of Related Art

In conventional liquid crystal apparatus having built-in peripheral circuits, peripheral circuits such as a data line driving circuit, a scanning line driving circuit, and a sampling circuit are formed on a TFT array substrate, which is one of two substrates between which a liquid crystal is disposed. In general, these peripheral circuits are produced using the same production process as that for producing TFTs for switching an image signal applied to pixel electrodes provided in respective pixels (hereinafter such TFTs will also be referred to as pixel TFTs) so as to achieve a high production efficiency.

On the TFT array substrate, there are provided a great number of data lines and scanning lines in an image displaying area in contact with the liquid crystal, wherein these data lines and scanning lines cross each other at different layer levels. Input/output wirings connected to peripheral circuits are disposed in a sealing area, outside the image displaying area and in contact with a scaling material for enclosing a liquid crystal, and in a peripheral area outside the sealing area. More specifically, leading wirings which extend from the data lines, the scanning lines, and the capacitance lines, and which serve as the input/output wirings for the peripheral circuits, are disposed in the sealing area and image signal lines, control signal lines, power supply lines, clock signal lines, and other signal lines, connected to external input terminals, and are disposed in the peripheral area.

In particular, in a liquid crystal apparatus having a sampling circuit as a peripheral circuit, when an image signal is supplied to an image signal line via an external input terminal, the image signal is sampled, from one data line to another, by sampling switches of the sampling circuit, in response to a sampling circuit driving signal output with predetermined timing from the data line driving circuit.

Because the image signal line is a signal line used to supply the image signal itself, which defines the voltage applied to the liquid crystal, it is extremely important that the image signal line has a low electric resistance and a small time constant to prevent degradation in the picture quality. To this end, the image signal line is generally formed of a thin metal film such as an aluminum film which has the lowest resistivity of all thin films used in the active matrix TFT liquid crystal apparatus, and which is also used to form data lines.

On the other hand, there are no currently available techniques which can be used to form the scanning lines of a thin metal film or a thin metal silicide film, because existing techniques would be subject to the problem that the scanning lines would peel off during a high-temperature process performed after the formation of the scanning lines. For the above reason, the scanning lines are generally formed of a thin polysilicon film. The wiring formed of a thin polysilicon film has as high a resistance as several ten times that of an wiring formed of a thin metal film, and thus has a correspondingly high time constant. For the above reason, if the image signal line was formed of a thin polysilicon film, degradation in the image quality would occur depending on the resistance and the time constant of the wiring employed as the image signal line. In practice, to avoid the above problem, the image signal line is formed of a thin metal film, as described above.

In the above-described type liquid crystal apparatus including the peripheral circuit, if there is only one image signal line, it is possible to form the image signal line with an wiring formed of a thin metal film at the same single layer lever (produced in the same process) over the entire path from an external circuit connecting terminal disposed at an end of a substrate to respective sampling switches of the sampling circuit. However, in the case where a plurality of image signal lines are required to transmit image signals serial-parallel converted into a plurality of phases so as to handle high-frequency driving operation in the liquid crystal apparatus, or in the case where a plurality of image signal lines are required to handle respective colors of an RGB color image signal, at least one image signal line has to cross another image signal line somewhere in the path to sampling switches. That is, it is impossible to produce wirings for all image signal lines using only a thin metal film at the same layer level.

Therefore, a interconnecting line (first wiring) is formed using a polysilicon film at a different layer separated by an interlayer insulating film from the thin metal film. More specifically, one wiring includes a second wiring made of a thin metal film and disposed at a crossing point. Another wiring includes a first wiring made of a thin polysilicon film extending at a different layer and crossing below or above the second wiring via an interlayer insulating film, wherein the first wiring is electrically connected to a part of the wiring made of thin metal film via contact holes formed, at both sides of the crossing point, in the interlayer insulating film.

If only a part, which crosses another wiring, is constructed in the form of a first wiring made of thin polysilicon film, and the other parts are constructed in the form of main wirings made of a thin metal film which are connected to each other via the first wirings as described above, then the first wiring made of the thin polysilicon film has a very small length, and thus the existence of the relay line made of the thin polysilicon film does not cause the image signal line to have no significant increases in the overall resistance and time constant that can cause a problem to occur during practical applications.

SUMMARY OF THE INVENTION

Problems to be Solved by the Invention

To meet the general requirement for improved image quality, the driving frequency of liquid crystal apparatus of XGA or SXGA type becomes increasingly higher. With the increase in the driving frequency, the number of serial-parallel converted phases becomes large. More specifically, 24 phases are employed recently.

However, to handle such a large number of serial-parallel convertion phases, it is required that a correspondingly great number of image signal lines to be disposed in parallel. As a result, the interconnecting lines made of the thin polysilicon film become longer. Because the resistance of the wiring increases in proportion to the length of the wiring, the resistance of the interconnecting lines becomes larger. As a result, the image signal lines have a large resistance and a large time constant which result in degradation in the image quality. More specifically, an increase in the resistance or the time constant of image signal lines causes the image signal to have fluctuations via coupling capacitance or causes the image signal on the previous line (column) to be written onto the next line (column), and thus a ghost or crosstalk occurs.

To avoid the above problem, if the interconnecting lines in the scaling area or periphery area are formed of a thin metal film which is not used in the pixel area, the efficiency of the production process based on the planar technology becomes low. As a result, the production cost becomes high and the fundamental advantages of the liquid crystal apparatus of the type including built-in peripheral circuits are lost.

In view of the above, it is an object of the present invention to provide an electrooptical apparatus, such as a liquid crystal apparatus of the type including a built-in peripheral circuit, in which the resistance of input/output wirings in the peripheral circuit is reduced by effectively using thin films forming pixels, thereby making it possible to display a high-quality image.

Means for Solving the Problems.

According to a first aspect of the present invention, to solve the above problems, there is provided an electrooptical apparatus including an electrooptical material disposed between a pair of substrates wherein, on one of the substrates, there are provided: a plurality of pixel electrodes arranged in a matrix fashion; a plurality of thin-film transistors that drive the plurality of pixel electrodes, respectively; a plurality of data lines connected to the plurality of thin-film transistors, respectively, and a plurality of scanning lines connected to the plurality of thin-film transistors, the plurality of data lines and the plurality of scanning lines crossing each other, a light blocking film disposed such that at least a channel region of each of the plurality of thin-film transistors is covered with the light blocking film; at least a peripheral circuit for supplying an image signal to the data lines; and peripheral wirings that input and output predetermined types of signals including the image signal to and from the peripheral circuit; wherein the peripheral wiring includes a first wiring having a first conductive film which is the same conductive film as the light blocking film and a second wiring including at least one of conductive films constituting the thin-film transistors, the data lines, and the scanning lines.

In the electrooptical apparatus according to the first aspect of the invention, the light blocking film is disposed such that at least the channel region of each of the plurality of thin-film transistors is covered with the light blocking film when viewed from the side of the one of substrates. Therefore, the channel region of each thin-film transistor is prevented by the light blocking film from being exposed to light, such as a reflected light ray coming from the side of the one of substrates, thereby preventing the thin-film transistors from being degraded in characteristics by the reflected light. In particular, in the present invention, the peripheral wirings include an wiring made of a conductive film (for example the thin film forming the data lines) which is one of a plurality of thin-film layers constituting the thin-film transistors, the data lines, and the scanning lines, and also include an wiring made of the first conductive film.

If the first conductive film is made of an electrically-conductive and refractory metal film including Ti (titanium), Cr (chromium), W (tungsten), Ta (tantalum), Mo (molybdenum), or Pb (lead), then the wiring resistance of the peripheral wiring is greatly reduced. In this technique, the first conductive film serves not only as a film for preventing the thin-film transistors from being exposed to light, but also as a peripheral wiring, and thus the structure and the production process can be simplified.

Therefore, various signals, including an image signal, can be input and output to and from the peripheral circuits via the peripheral wirings that have low resistance. Therefore, the driving frequency of the electrooptical apparatus can be increased or the number of serial-parallel conversion phases or the number of image signals which are input in parallel can be increased without causing voltage fluctuations, ghosts, or crosstalk due to capacitive coupling associated with the peripheral wirings such as image signal lines, which are problems in the conventional technique, thereby ensuring that a high-quality image is displayed.

In this mode, of the electrooptical apparatus according to the first aspect of the invention wherein the first wiring include the first conductive film and a second conductive film which is at least one of conductive films constituting the thin film transistors, the data lines and the scanning lines, and the second wiring include a third conductive film which is at least one of conductive films constituting the thin film transistors, the data lines, and the scanning lines and is different from the second conductive film.

In one mode of the electrooptical apparatus according to the first aspect of the invention, the peripheral wirings include the first wiring made of the first conductive film and the second conductive film, the second conductive film being made of a conductive film, which is one of the plurality of thin-film layers constituting the thin film transistors, the data lines and the scanning lines, the second wiring being made of the third conductive film.

In this mode, the first wiring of the peripheral wiring is made of the first conductive film and the second conductive film. The second wiring of the peripheral wiring is made of the third conductive film. Therefore, when the third conductive film is made of a thin film layer having a low resistance such as a metal film, and the second conductive film is made of a thin film such as a polysilicon film having a higher resistance than the first conductive film, the overall resistance of the peripheral wiring becomes lower by an amount corresponding to the reduction in the resistance of the second wiring achieved by the existence of the first conductive film compared with a combination of two types of conventional peripheral wirings made of the third and second conductive films, respectively, into a single layer structure, which cross each other somewhere. For example, when the second conductive film is formed of a polysilicon film and the first conductive film is formed of a refractory metal film having a high conductivity including Ti, Cr, W, Ta, Mo, or Pb, the resistance of the first wiring, measured along the wiring, is dominated by the sheet resistance of the first conductive film. Thus, it becomes possible to greatly reduce the resistance of the first wiring compared with the first wiring formed of only a single layer of polysilicon according to the conventional technique. Furthermore, in the present invention, the resistance of the second wiring can be reduced by employing the third conductive film such as Al (aluminum). Thus, the peripheral wiring including a first wiring and a second wiring electrically connected in series to each other has a low enough resistance.

Furthermore, the peripheral wiring has a redundant structure in which even if either a part formed of the thin polysilicon film or a part formed of the third conductive film of the first wiring is broken due a foreign particle or the like, the electrical conduction is still maintained via the remaining part. Since the first wiring that has the small resistance is formed using the first conductive film, which is also used to form pixels, and also using the first conductive film which is also used to protect the TFTs from light, the first wiring according to the present invention can be produced without causing a significant reduction in the production efficiency of the production process of the electrooptical apparatus with a planar structure. Thus, it is possible to achieve fundamental advantages of the electrooptical apparatus of the type including built-in peripheral circuits.

In the peripheral wiring including the first wiring and the second wiring according to the present invention, the second wiring made of the same film as the third conductive film may also be formed into a two-layer or three-layer structure by adding a redundant wiring. Such a multilayer wiring still includes the second wiring according to the invention. Furthermore, an additional redundant wiring may be added to the first wiring made of the same film as the second conductive film and the first conductive film so as to obtain an wiring structure including three or more layers. Such a multilayer wiring still includes a two-layer wiring according to the invention.

In the mode of the electrooptical apparatus according to the first aspect of the invention in which the peripheral wiring includes the first wiring, the second conductive film may have a resistance higher than that of the third conductive film.

In this structure, the third conductive film, such as aluminum, has the lowest resistance of all thin films used to form the thin-film transistors, and the second conductive film, such as the low-resistance polysilicon film, has the next lowest resistance of all thin films used to form the thin-film transistors. As a result, the overall resistance of the peripheral wiring becomes lower by an amount of reduction in the resistance of the first wiring achieved by employing the third conductive film having a high conductivity compared with the case where peripheral wirings are formed of third and second conductive films in a single-layer structure crossing each other at different layer levels, according to the conventional technique.

In a mode of the electrooptical apparatus according to the first aspect of the invention in which the peripheral wirings include the first wiring, the electrooptical apparatus further includes a first interlayer insulating film disposed between the third conductive film and the thin-film transistors; and a second interlayer insulating film disposed between the third conductive film and the second conductive film; wherein the first wiring includes a interconnecting line which is electrically connected to a part of the second wiring and which crosses another part of the second wiring in a three-dimensional fashion via the first or second interlayer insulating films.

In this mode, the interconnecting line is electrically connected to a part of the second wiring and crosses another part of the second wiring in a three-dimensional fashion via the first or second interlayer insulating film (that is, the interconnecting line passes over or under another part of the single-layer wiring). That is, because peripheral wirings must cross each other somewhere, it is impossible to dispose all peripheral wirings at the same layer level. This problem is solved by employing a interconnecting line. That is, the interconnecting line makes it possible to dispose peripheral wirings into any desired pattern.

In the mode of the electrooptical apparatus according to the first aspect of the invention in which the first wiring includes the interconnecting line, the peripheral wirings may include an image signal line for supplying the image signal from an external input terminal; and the peripheral circuit may include a sampling circuit for sampling the image signal, a data line driving circuit for driving the sampling circuit with predetermined timing thereby supplying the image signal on the image signal line to the plurality of data lines via the sampling circuit, and a scanning line driving circuit for driving the scanning lines.

This allows the image signal line, which has to cross another peripheral wiring somewhere and which could not be disposed in a desired manner if it were disposed at the same layer level, to be disposed in any desired pattern via a interconnecting line.

In the mode of the electrooptical apparatus according to the first aspect of the invention in which the peripheral wirings include the image signal line, the image signal may be serial-parallel converted to N phases (where N is an integer equal to or greater than 2) and there may be provided N image signal lines, and the N image signal lines may include a interconnecting line at a location where some of the N image signal lines cross to each other.

In this structure, increases in the resistance and time constant of the interconnecting line are minimized even when long interconnecting lines are required to handle a large number (N) of serial-parallel conversion phases, or to handle a large number of image signals which are input in parallel as is the case with RGB color image signals, in particular compared with the case where interconnecting lines are formed of a single layer of a thin polysilicon film according to the conventional technique.

In the mode of the electrooptical apparatus according to the first aspect of the invention in which the peripheral wirings include the image signal line, the electrooptical apparatus may further include a plurality of sampling circuit driving signal lines that supply a sampling circuit driving signal from the data line driving circuit to the sampling circuit, and at least a part of the sampling circuit driving signal lines which crosses any of the image signal lines may be made of the interconnecting line.

This technique makes it possible to form sampling circuit driving signal lines extending from the data line driving circuit to the sampling circuit using interconnecting lines disposed at locations where they cross for example an image signal line. Furthermore, this technique allows the wiring layout to be designed in a more flexible manner. Still furthermore, increases in the resistance and time constant of the sampling circuit driving signal lines can be reduced compared with the case where interconnecting lines of the sampling circuit driving signal lines are formed of a single layer of a thin polysilicon film according to the conventional technique.

In the mode of the electrooptical apparatus according to the first aspect of the invention in which the peripheral wirings include the first wiring, the second conductive film and the first conductive film both constituting the two-layer wiring may be electrically connected to each other via a contact hole formed in the first interlayer insulating film.

This technique makes it possible to obtain a high-reliability first wiring whose layers are electrically connected to each other via a contact hole. The contact hole for this purpose may be formed relatively easily using the process for producing the pixel TFTs.

In the mode of the electrooptical apparatus according to the first aspect of the invention in which the peripheral wirings include the two-layer wiring, the third conductive film may be made of a thin metal film forming the data lines connected to the source or drain of the thin-film transistors, and the second conductive film may be made of a thin polysilicon film forming the scanning lines including gate electrodes of the thin-film transistors.

In this case, because the second wiring is formed of the thin metal film, such as aluminum, the single-layer wiring has a low resistance. Although the part formed of the thin polysilicon film has a resistance 200 times greater than that of the thin metal film, that part has a parallel path formed of the first conductive film with electrical conductivity, and thus the overall resistance of the first wiring is much smaller than the resistance of the thin polysilicon film. If the first conductive film is made of metal, including at least one of Ti, Cr, W, Ta, Mo, or Pb or a metal silicide, the overall resistance and time constant can be reduced to several tenths (for example, about ½ or ⅓) of those that would be obtained with a single-layer of thin polysilicon film.

In the mode of the electrooptical apparatus according to the first aspect of the invention in which the peripheral wirings include the two-layer wiring, the electrooptical apparatus may further include a sealing material for enclosing the electrooptical material between the pair of substrates, and at least three films including the first conductive film, the second conductive film, and the light blocking film may be disposed in a multilayer fashion in a sealing area, in contact with the sealing material, on the one of substrate, around the periphery of the electrooptical material, and furthermore, the leading wirings of the data lines and scanning lines extending across the sealing area may be formed of at least one of the above-described three films.

In this structure, the electrooptical material is enclosed by the sealing material between the pair of substrates such that a so-called electrooptical cell is formed. Because at least three films including the third conductive film, the second conductive film, and the first conductive film are disposed in a multilayer fashion in the sealing area around the periphery of the electrooptical material, it is possible to minimize the variation in the gap, including the effects of various thin films, between the two substrates over the entire sealing area around the electrooptical material. Thus, it becomes possible to more precisely control the gap of the liquid crystal cell when the gap is controlled by the sealing material containing gap materials with a particular diameter. Furthermore, by using the leading wirings of the data lines and scanning lines, which are formed of at least one of the three films and which extend across the sealing area, it is possible to supply signals into the image displaying area without encountering any problems.

In the mode of the electrooptical apparatus according to the first aspect of the invention in which the three-layer film is disposed in the sealing area, the healing wirings may each include a two-layer or three-layer wiring whose layers are made of at least two of the three films, respectively, wherein the layers are electrically connected to each other via a contact hole. This structure allows a reduction in the resistance of the leading wirings.

Alternatively, the leading wirings may each include a single-layer wiring made of one of the three films, and the other two films of the three films may be dummy wirings which do not serve as an wirings in the sealing region. In this structure, the gap in the sealing area between the two substrates is determined by the thickness of the dummy wirings, and thus it is possible to relatively easily minimize the variation in the gap.

In the mode of the electrooptical apparatus according to the first aspect of the invention in which the peripheral wirings include the first wiring, the first wiring may have such a structure that the part made of the first conductive film is covered with the part made of the second conductive film when viewed from the side of the other one of the pair of substrates.

In this mode, because the part, made of the first conductive film, of the two-layer wiring is covered with the part made of the second conductive film, the single-layer wiring such as an image signal line crossing the part made of the first conductive film has a less capacitive coupling with the part made of the first conductive film, and thus the increase in the time constant associated with the single-layer wiring causes by the capacitive coupling can be suppressed. In particular, when the second conductive layer is disposed between the first conductive film and the third conductive film, it is possible to suppress the increase in the capacitive coupling between the first conductive film and the first conductive film in the structure in which the first conductive film is employed in the first wiring. This makes it possible to effectively prevent degradation in the image signal at the single-layer wiring of the image signal line.

In the mode of the electrooptical apparatus according to the first aspect of the invention in which the part made of the first conductive film is covered with the part made of the second conductive film, in the first wiring, the part made of the first conductive film may have an wiring width smaller than the part made of the second conductive film.

This technique ensures that the increase in capacitive coupling between the first conductive film and the third conductive film is suppressed.

According to a second aspect of the present invention, to solve the above problems, there is provided an electrooptical apparatus including an electrooptical material disposed between a pair of substrates wherein, on one of the substrates, there are provided: a plurality of scanning lines; a plurality of data lines; thin-film transistors connected to the plurality of scanning lines, respectively, and also to the plurality of data lines, respectively; pixel electrodes connected to the respective thin-film transistors; an electrically-conductive light blocking film disposed such that at least the channel region of each thin-film transistor is covered with the light blocking film when viewed from the side of the one of substrates; a plurality of image signal lines that supply an image signal; and a sampling circuit that samples the image signals supplied via the plurality of image signal lines and supplies the resultant signals to the plurality of data lines, respectively; wherein at least a part of each of interconnecting lines connecting the image signal lines to the sampling circuit is made of a third conductive film which is made of the same layer as the light blocking film.

In the electrooptical apparatus according to the second aspect of the invention, because at least a part of each of interconnecting lines connecting the image signal lines to the sampling circuit is made of the third conductive film, it is possible to obtain a lower resistance for the interconnecting lines compared with the case where, of thin film layers forming the thin-film transistors, the data lines, and the scanning lines, the second conductive film having a lower conductivity than the first conductive film is selected as the material of the interconnecting lines. If the third conductive film is formed of, for example, a refractory metal film having electrical conductivity, it is possible to greatly reduce the wiring resistance of the interconnecting lines. In this case, the first conductive film serves not only as a film that prevents the thin-film transistors from being exposed to light but also as a peripheral wiring, and thus the construction and the production process can be simplified.

In this technique, because the image signals are input to the sampling circuit via the interconnecting lines having low resistance, the driving frequency of the electrooptical apparatus can be increased, or the number of serial-parallel converted phases, or the number of image signals which are input in parallel can be increased without causing voltage fluctuations, ghosts, or crosstalk due to capacitive coupling associated with the interconnecting lines of, for example, image signal lines, which are problems in the conventional technique, thereby ensuring that a high-quality image is displayed.

In one mode of the electrooptical apparatus according to the second aspect of the invention, at least a part of sampling circuit driving signal lines that supply a sampling circuit driving signal to the sampling circuit is made of the first conductive film.

In this mode, because at least a part of sampling circuit driving signal lines is made of the first conductive film with electrical conductivity, it is possible to obtain a lower resistance for the sampling circuit driving signal lines compared with the case where, of thin film layers forming the thin-film transistors, the data lines, and the scanning lines, the second conductive film that has a lower conductivity than the first conductive film is selected as the material of the sampling circuit driving signal lines. Because the sampling circuit drive signals are input to the sampling circuit via sampling circuit driving signal lines having low resistance, it is possible to display a high-quality image.

To solve the problems described earlier, the invention provides a first method of producing an electrooptical apparatus including an electrooptical material disposed between a pair of substrates wherein, on one of the substrates, there are provided: a plurality of scanning lines; a plurality of data lines; thin-film transistors connected to the plurality of scanning lines, respectively, and also to the plurality of data lines, respectively; pixel electrodes connected to the respective thin-film transistors; an electrically-conductive light blocking film disposed such that at least the channel region of each thin-film transistor is covered with the light blocking film when viewed from the side of the one of substrates; a plurality of image serial lines that supply an image signal; and a sampling circuit that samples the image signals supplied via the plurality of image signal lines and supplies the resultant signals to the plurality of data lines, respectively; the method including the steps of: forming the light blocking film and first interconnecting lines that connect the image signal lines to the sampling circuit using the same material; forming a first interlayer insulating film on the first interconnecting lines and the light blocking film; forming the scanning lines on the first interlayer insulating film and also forming a second interconnecting line connected to the first interconnecting line via a contact hole formed in the first interlayer insulating film; forming a second interlayer insulating film on the scanning lines and the second interconnecting line; and forming the data lines connected to the thin-film transistors via contact holes formed in the second interlayer insulating film and also forming the image signal lines connected to the second interconnecting line.

In the first method of producing the electrooptical apparatus according to the invention, the light blocking film and the first interconnecting lines that connect the image signal lines to the sampling circuit are formed using the same material. This allows simplification in the production process. Then the first interlayer insulating film is formed on the first interconnecting lines and the light blocking film, and scanning lines are formed on this first interlayer insulating film. The second interconnecting line is then formed such that it is connected to the first interconnecting line via a contact hole formed in the first interlayer insulating film. The second interlayer insulating film is then formed on the scanning lines and the second interconnecting line. After that, the data lines connected to the thin-film transistors via contact holes formed in the second interlayer insulating film and also the image signal lines connected to the second interconnecting lines are formed. Thus, in this technique, because the image signals are input to the sampling circuit via the interconnecting lines that have low resistance, it is possible to produce an electrooptical apparatus capable of displaying a high-quality image, even if the driving frequency of the electrooptical apparatus is increased, or the number of serial-parallel conversion phases, or the number of image signals which are input in parallel is increased.

To solve the problems described earlier, the invention also provides a second method of producing an electrooptical apparatus including an electrooptical material disposed between a pair of substrates wherein, on one of the substrates, there are provided: a plurality of scanning lines; a plurality of data lines; thin-film transistors connected to the plurality of scanning lines, respectively, and also to the plurality of data lines, respectively; pixel electrodes connected to the respective thin-film transistors; an electrically-conductive light blocking film disposed such that at least the channel region of each thin-film transistor is covered with the light blocking film when viewed from the side of the one of substrates; a plurality of image signal lines that supply an image signal; and a sampling circuit that samples the image signals supplied via the plurality of image signal lines and supplies the resultant signals to the plurality of data lines, respectively; the method including the steps of forming the light blocking film and first interconnecting lines that connect the image signal lines to the sampling circuit using the same material; forming a first interlayer insulating film on the first interconnecting lines and the light blocking film; successively forming a plurality of films into a multilayer structure on the first interlayer insulating film, the plurality of films including a semiconductor layer acting as a source and drain of each thin-film transistor, a gate insulating film, and a gate electrode; forming a second interlayer insulating film on the gate electrode; and forming the data lines connected to the thin-film transistors via contact holes formed in the second interlayer insulating film and also forming image signal lines connected to the first interconnecting lines via contact holes formed in the first and second interlayer insulating films.

In the second method of producing the electrooptical apparatus according to the invention, the light blocking film and the first interconnecting lines for connecting the image signal lines to the sampling circuit are formed using the same material. This allows simplification in the production process. After that, the first interlayer insulating film is formed on the first interconnecting lines and the light blocking film. Furthermore, the semiconductor layer acting as a source and drain of each said thin-film transistor, the gate insulating film, and the gate electrode are successively formed into the multilayer structure on the first interlayer insulating film. The second interlayer insulating film is then formed on the gate electrode. Furthermore, the data lines connected to the thin-film transistors via contact holes formed in the second interlayer insulating film are formed. After that, the image signal lines connected to the first interconnecting line via contact holes formed in the first and second interlayer insulating films are formed. Thus, in this technique, because the image signals are input via the interconnecting lines that have low resistance, it is possible to produce an electrooptical apparatus capable of displaying a high-quality image, even if the driving frequency of the electrooptical apparatus is increased, or the number of serial-parallel conversion phases, or the number of image signals which are input in parallel is increased.

These and other features and advantages of the present invention will become more apparent from the following detailed description referring to the following drawings.

DETAILED DESCRIPTION OF PREFERRED EMBODIMENTS

Description of the Embodiments

Figure 1:
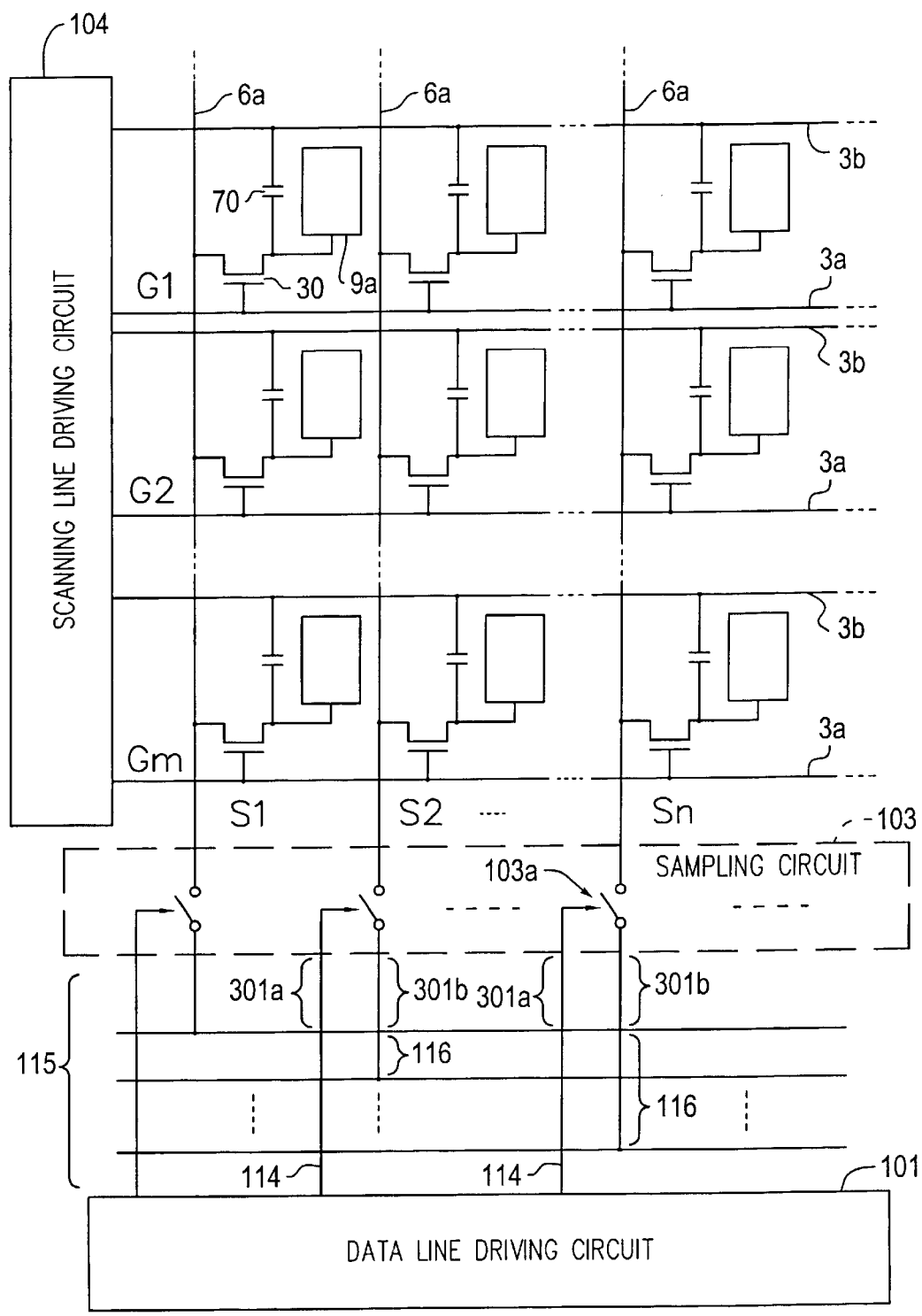
FIG. 1 is a schematic of a liquid crystal apparatus, including equivalent circuits of wirings of various elements provided in respective pixels arranged in a matrix fashion in an image display area and peripheral circuits, according to an embodiment of the invention.

Referring to the drawings, embodiments of the invention are described below. In the embodiments described below, a liquid crystal apparatus is taken as an example of an electrooptical apparatus according to the invention.

Construction and Operation of Liquid Crystal Apparatus

Referring to FIGS. 1 to 10, the construction and the operation of a liquid crystal apparatus according to an embodiment of the invention are described below.

First, the circuit configuration of the liquid crystal apparatus is described with reference to the schematic shown in FIG. 1.

FIG. 1 illustrates an equivalent circuit of wirings and various other elements in a plurality of pixels formed in an array fashion in an image displaying area on an TFT array substrate of the liquid crystal apparatus, and also illustrates peripheral circuits disposed in a peripheral area outside the image displaying area.

In the present embodiment, as shown in FIG. 1, a plurality of pixels are arranged in a matrix fashion in the image displaying area of the liquid crystal apparatus, and respective pixels comprise a plurality of pixel electrodes 9a and a plurality of TFTs 30 that control the respective pixel electrodes 9a. The source of each TFT 30 is electrically connected to a data line 6a through which an image signal is supplied. Although image signals may be supplied to data lines 6a in a line-sequential fashion in the order S1, S2, ..., Sn, the image signals S1, S2, ..., Sn, in the present embodiment, may be serial-parallel converted into N phases (where N is an integer equal to or greater than 2) and image signals with the serial-parallel converted phases may be supplied via the N image signal lines 115 to N adjacent data lines 6a from one group to another, each including N data lines 6a.

The gate of each TFT 30 is electrically connected to a scanning line 3a. Scanning signals are applied to the scanning lines 3a with predetermined timing in a line-sequential fashion in the order G1, G2, ..., Gm. Each pixel electrode 9a is electrically connected to the drain of a corresponding TFT 30. By closing TFTs 30 serving as switching elements for a particular period of time, image signals S1, S2, ..., Sn supplied via the data lines 6a are written with predetermined timing. The image signals at particular levels written via the pixel electrodes 9a into the liquid crystal serving as an electrooptical material are held for a fixed period of time between the pixel electrodes 9a and an opposite electrode (which will be described later) formed on an opposite substrate (which will be described later). The liquid crystal changes in the orientation or order of molecules depending on the applied voltage level. Light is modulated as a result of the change in the orientation of the liquid crystal, and thus an image with various intensity levels is displayed. In a normally white mode, an incident light ray is blocked by the liquid crystal to a degree determined by the applied voltage. On other hand, in a normally black mode, the incident light ray is allowed to pass through the liquid crystal to a degree determined by the applied voltage. The liquid crystal apparatus as a whole emits light forming an image with a contrast corresponding to the image signal. To prevent leakage of the image signal held, there is provided a storage capacitor 70 added in parallel to a liquid crystal capacitance formed between each pixel electrode 9a and the opposite electrode. For example, the voltage of the pixel electrode 9a is held by the storage capacitor 70 for a period of time which is 3 orders of magnitude longer than the period of time during which the source voltage is applied. This allows a further improvement in the holding characteristic, and it becomes possible to realize a liquid crystal apparatus having a high contrast ratio. The storage capacitor 70 may be formed by forming a capacitance line 3b with a capacitance component, or by forming capacitance with the scanning line 3a at the previous stage.

In FIG. 1, the liquid crystal apparatus includes peripheral circuits such as a data line driving circuit 101 that drives the data lines 6a, scanning line driving circuit 104 that drives the scanning lines 3a, and a sampling circuit 103 that samples the image signal, which are disposed in an peripheral area outside the image displaying area on the TFT array substrate, wherein the data lines 6a and scanning lines 3a are formed in the image displaying area as described above. In the peripheral area outside the image displaying area, there are provided N image signal lines 115, which are examples of peripheral wirings, that supply image signals S1, S2, . . . , Sn with N of serial-parallel converted data input via the external input terminals.

N-phase image signals S1, S2, . . . , Sn are supplied to the image signal lines 115 from a control circuit (not shown) via external input terminals. The number (N) of serial-parallel conversion data may be set to a rather small value such as 3 or 6 when the sampling ability of the sampling circuit 103 is relatively high. If the sampling ability is relatively low, the number of phases is preferably set to 12 or 24.

In particular, in the present embodiment, because the resistance of the interconnecting lines 116, whose length become longer depending on the number (N) of serial-parallel conversion phases or the number (N) of image signal lines 115, is reduced by employing the two-layer wiring structure, it is possible to increase the number (N) of serial-parallel conversion phases (the number of image signal lines 115) and effectively reduce the delay of transmission of the image signals. Thus, it is possible to increase the driving frequency of the liquid crystal apparatus without causing degradation in the image quality. Because the color image signal contains information of three colors (red, blue, green), if the number (N) of serial-parallel conversion phases is set to an integral multiple of 3, it becomes possible to simplify the controlling process and circuits required to display a video signal according to the NTSC or PAL standard.

When the image signal is not serial-parallel converted into phases, if there are provided a plurality of image signal lines, for example, to handle RGB color image signals, the structure including low-resistance interconnecting lines according to the present embodiment, which will be described below, is still useful.

In the present embodiment, the resistance of the sampling circuit driving signal lines 114 extending from the data line driving circuit 101 to the sampling circuit 103 can be also reduced by employing the two-layer wiring structure, as will be described in detail layer.

In response to the gate voltage in the form of a series of pulses transmitted to the scanning lines 3a from the scanning line driving circuit 104, the data line driving circuit 101 supplies sampling circuit driving signals via the sampling circuit driving signal lines 114 to the control terminals of the respective sampling switches 103a in the sampling circuit 103. In response to the sampling circuit driving signals, the sampling circuit 103 samples the image signals supplied to the image signal lines 115 from the external circuit, and supplies the resulting signals to the data lines 6a.

To achieve a high production efficiency, it is preferable that the respective sampling switches 103a in the sampling circuit 103 be produced into the form of n-channel type, p-channel type, or complementary type TFTs, which can be produced in the same production process for the TFTs 30 used in pixels.

Figure 2:
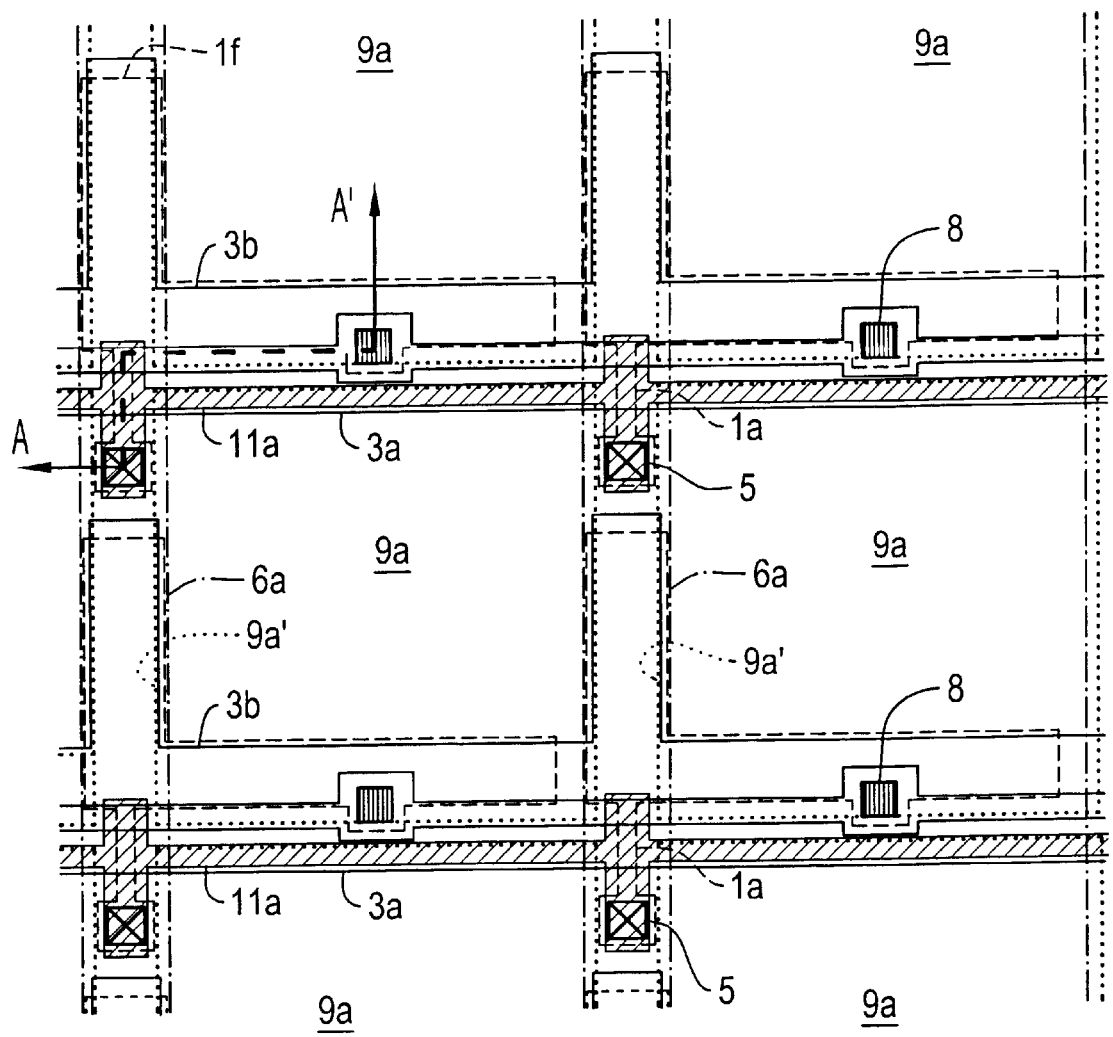
FIG. 2 is a plan view illustrating a plurality of adjacent pixels including data lines, scanning lines, and pixel electrodes formed on a TFT array substrate of the liquid crystal apparatus according to the embodiment of the invention.
Figure 3:
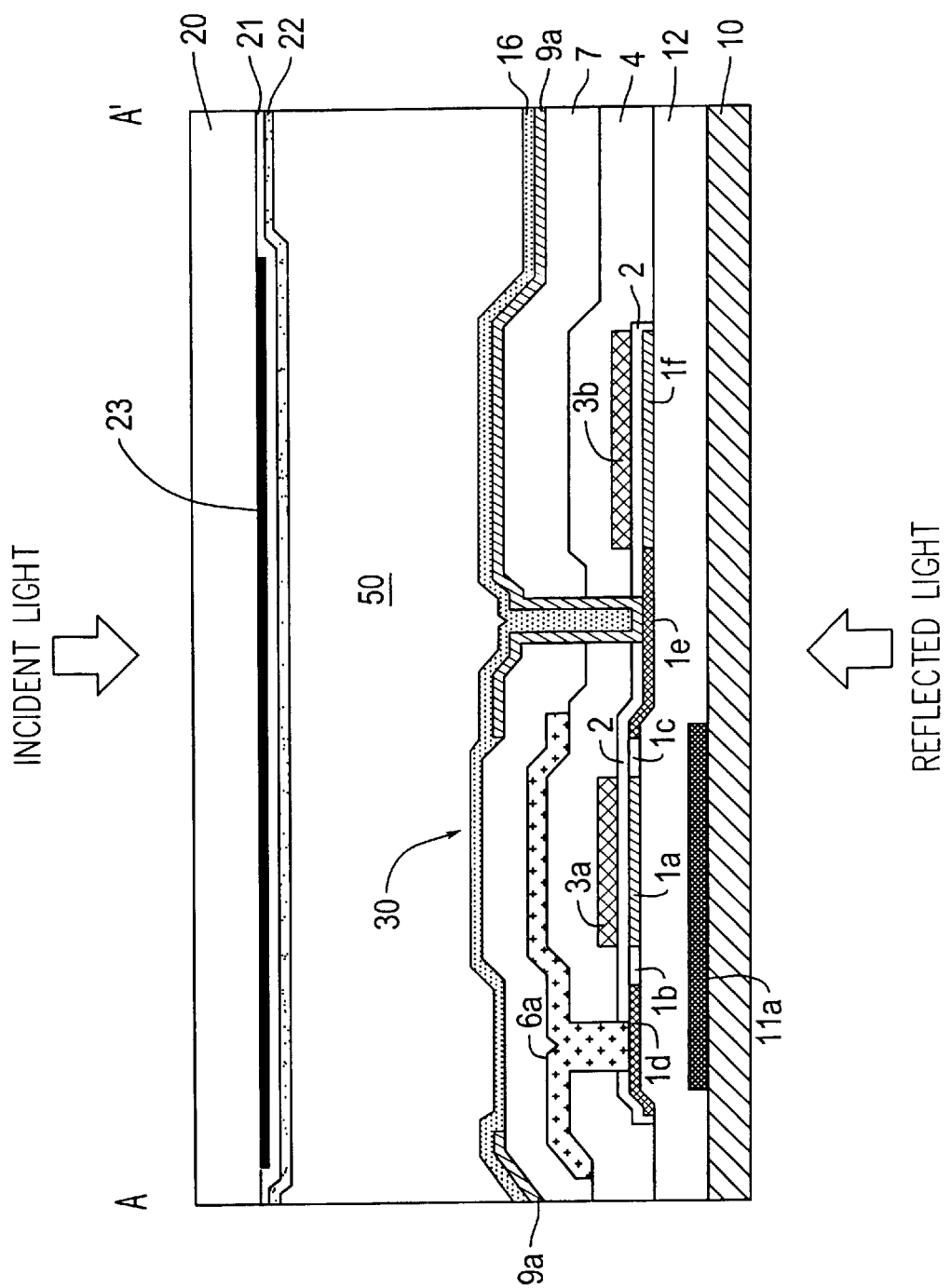
FIG. 3 is a cross-sectional view taken along plane A-A' of FIG. 2.

Referring now to FIGS. 2 and 3, the construction of pixels in the image displaying area of the liquid crystal apparatus is described below. FIG. 2 is a plan view illustrating a plurality of adjacent pixels formed on the TFT array substrate, wherein data lines, scanning lines, pixel electrodes, and a light blocking film are shown in the figure. FIG. 3 is a cross-sectional view taken along plane A-A' of FIG. 2. In FIG. 3, the layers and other elements are shown such that they have a large enough size in the figure in order to provide a visible representation, and thus they are not drawn to scale.

On the TFT array substrate of the liquid crystal apparatus, as shown in FIG. 2, a plurality of transparent pixel electrodes 9a (contours thereof are denoted by broken lines 9a) are formed in a matrix fashion and data lines 6a, scanning lines 3a, and capacitance lines 3b are formed in such a manner that the data lines 6a extend along the vertical boundaries of the pixel electrodes 9a and the scanning lines 3a, and the capacitance lines 3b extend along the horizontal boundaries. The data lines 6a are electrically connected via contact holes 5 to corresponding source regions, which will be described later, of a semiconductor layer 1a made of a polysilicon film or the like. The pixel electrodes 9a are electrically connected via contact holes 8 to corresponding drain regions, which will be described later, of the semiconductor layer 1a. The data line 6a is disposed at a location corresponding to the channel region, which will be described layer, of the semiconductor layer 1a. First light blocking films 11a are formed in areas, hatched with lines slanted to right in FIG. 2, in the respective pixels. That is, the first light blocking films 11a are formed at locations so that at least channel regions and the junction between the channel region and the source region and the junction between the channel region and the drain region of the semiconductor layer 1a are covered with the corresponding first light blocking films 11a when viewed from the side of the TFT array substrate. For the purpose of preventing the pixel TFTs from having leakage due to a photocurrent, the first light blocking films 11a are required to cover only the channel regions of the semiconductor layer 1a. However, in the present embodiment, the first light blocking films 11a are provided in the form of stripes extending along the scanning lines 3a so that the first light blocking films 11a also serve as wirings for maintaining the first light blocking films 11a themselves at a constant voltage, and so that the first light blocking films 11a also serve to define opening areas (through which light is allowed to pass) in the pixels.

As shown in FIG. 3, the liquid crystal apparatus includes a TFT array substrate 10 serving as an example of a transparent substrate which is one of two substrates, and also includes an opposite substrate 20 serving as an example of the other transparent substrate disposed at a location opposing the TFT array substrate 10. The TFT array substrate 10 is made of, for example, a quartz substrate, and the opposite substrate 20 is made of, for example, a glass substrate or a quartz substrate. Pixel electrodes 9a are formed on the TFT array substrate 10, and an orientation film 16 subjected to an orientation process, such as a rubbing process, is further formed thereon. The pixel electrodes 9a are made of transparent conducting thin films, such as ITO (Indium Tin Oxide) films. The orientation film 16 is made of an organic thin film, such as a polyamide thin film.

Furthermore, as shown in FIG. 3, pixel switching TFTs 30 that switch the pixel electrodes 9a are disposed on the TFT array substrate 10, at locations adjacent to the respective pixel electrodes.

An opposite electrode (common electrode) 21 is formed over an entire surface of the opposite substrate 20. Under the opposite electrode 21, there is provided an orientation film 22 subjected to an orientation process, such as a rubbing process. The opposite electrode 21 is made of a transparent conducting thin film, such as an ITO film. The orientation film 22 is made of an organic thin film, such as a polyimide thin film.

On the opposite substrate 20, as shown in FIG. 3, there is also provided a second light blocking film 23 in an area other than the opening areas of the respective pixels. The second light blocking film 23 prevents the incident light coming from the side of the opposite substrate 20 from striking the channel region 1a' or the source side LDD (lightly doped drain) regions 1b and the drain side LDD region 1c of the semiconductor layer 1a of the TFTs 30 serving as pixel switching elements. The second light blocking film 23 also serves to improve the contrast and prevent the colors of coloring materials from mixing.

A liquid crystal is placed into a space surrounded by a sealing material, which will be described layer, and formed between the TFT array substrate 10 and the opposite substrate 20, which are disposed so that the pixel electrodes 9a and the opposite electrode 21 face each other, thereby forming a liquid crystal layer 50. When no electric field is applied from the pixel electrode 9a to the liquid crystal layer 50, the liquid crystal layer 50 is oriented in a particular direction determined by the orientation films 16 and 22. The liquid crystal layer 50 is made of one type of nematic liquid crystal, or a mixture of two or more types of nematic liquid crystals. The sealing material 52 is an adhesive such as a photo-curing resin or a thermal curing resin by which the TFT array substrate 10 and the opposite substrate 20 are bonded to each other along their peripheries. The sealing material 52 contains a spacer made of glass fibers or glass beads, whereby the two substrates are spaced from each other by a predetermined distance.

As shown in FIG. 3, first light blocking films 11a are formed between the TFT array substrate 10 and the respective pixel switching TFTs 30, at locations corresponding to the respective pixel switching TFTs 30. Preferably, the first light blocking films 11a are made of element metal, an alloy, or a metal silicide, including at least one opaque and refractory metal selected from the group consisting of Ti, Cr, W, Ta, Mo, and Pb. If such a material is employed, the first light blocking films 11a are not broken or melted by a high temperature treatment in the process of forming the pixel switching TFTs 30 performed after the process of forming the first light blocking films 11a on the TFT array substrate 10. The presence of the first light blocking films 11a prevents a light ray reflected by the TFT array substrate 10 from being incident on the channel regions 1a' or the lightly doped source regions 1b and the lightly doped drain regions 1c of the pixel switching TFTs 30, thereby preventing the pixel switching TFTs 30 from having degradation due to a photocurrent.

Furthermore, the first interlayer insulating film 12 is disposed between the first light blocking films 11a and the plurality of pixel switching TFTs 30. The first interlayer insulating film 12 serves to electrically isolate the semiconductor layer 1a of the respective pixel switching TFTs 30 from the first light blocking films 11a.

In the present embodiment, the storage capacitors 70 are formed as follows. That is, the insulating films 2, between the gate electrode formed by a part of the scanning line 3a and the semiconductor layer 1a, are extended from the locations under the scanning line 3a, so that the extended portions are used as the dielectric films of the respective storage capacitors 70, the semiconductor layers 1a are extended and used as the first storage capacitor electrodes 1f, and parts of the capacitance lines 3b at corresponding locations are used as the second storage capacitor electrodes. More specifically, the heavily doped drain region 1e of each semiconductor layer 1a is extended into an area under the corresponding data line 6a and the scanning line 3a, and also extended into an area under the capacitance line 3b extending along the data line 6a and the scanning line 3a, so that the extended portion of the semiconductor layer acts as the first storage capacitor electrode 1f which opposes the data line 6a, the scanning line 3a, and the capacitance line 3b via the insulating film 2. In this technique, the dielectric film 2 serving as the dielectric of the storage capacitor 70 is realized using the gate insulating film, itself formed on the polysilicon film by means of high-temperature oxidation, and thus it is possible to achieve a thin insulating film with a high breakdown voltage. Therefore, it is possible to achieve a storage capacitor 70 having a high capacitance using a rather small area.

In FIG. 3, each pixel switching TFT 30 has an LDD structure that includes a scanning line 3a, a channel region 1a' in the semiconductor layer 1a where a channel is formed by an electric field from the scanning line 3a, an insulating film 2 isolating the semiconductor layer 1a from the scanning line 3a, data line 6a (source electrode), a lightly doped source region (an LDD region on the source side) 1b in the semiconductor layer 1a, a lightly doped drain region (an LDD region on the drain side) 1c in the semiconductor layer 1a, a heavily doped source region 1d in the semiconductor layer 1a, and a heavily doped drain region 1e in the semiconductor layer 1a. The heavily doped drain region 1e is connected to a corresponding one of the plurality of pixel electrodes 9a. The lightly doped source regions 1b and the heavily doped source regions 1d and the lightly doped source regions 1c and the heavily doped drain regions 1e are formed, as will be described in further detail later, by doping an n-type or p-type dopant into the semiconductor layer 1a to a proper concentration, wherein the type of the dopant is selected depending on whether an n-type or p-type channel is formed. The n-channel TFT has the advantage that it can operate at a high speed, and thus n-channel TFTs are usually employed as the pixel switching TFTs 30. In the present embodiment, the data line 6a is preferably made of an opaque thin film, such as a thin aluminum film or similar metal film, or otherwise an alloy film, such as a metal silicide film. The second interlayer insulating film 4 is formed over the scanning line 3a, the insulating film 2, and the first interlayer insulating film 12, wherein contact holes 5 reaching the respective heavily doped source regions 1d and contact holes 8 reaching the respective heavily doped drain regions are formed in the second interlayer insulating film 4. The data lines 6a are electrically connected to the corresponding heavily doped source regions 1d via the respective source contact holes 5. Furthermore, the third interlayer insulating film 7 is formed over the data lines 6a and the second interlayer insulating film 4, wherein contact holes 8 for the heavily doped drain regions 1e are formed in the third interlayer insulating film 7. The pixel electrodes 9a are electrically connected to the corresponding heavily doped regions 1e via the contact holes 8 for the heavily doped drain regions 1e. The pixel electrodes 9a described above are formed on the upper surface of the third interlayer insulating film 7 formed in the above-described manner.

As described above, each pixel switching TFT 30 is preferably formed into the LDD structure. However, the pixel switching TFTs 30 may also formed into an offset structure in which no impurity ions are implanted into the lightly doped source region 1b and the lightly doped drain region 1c. Alternatively, the pixel switching TFTs 30 may be formed into a self-aligned structure which may be obtained by implanting high-concentration impurity ions using the gate electrode formed as a part of the scanning line 3a as a mask, thereby forming heavily doped source and heavily doped drain regions in a self-aligned manner.

Although in the present embodiment, each pixel switching TFT 30 has a single-gate structure in which only a single gate electrode formed by a part of the scanning line 3a is disposed between the heavily doped source region 1d and the heavily doped drain region 1e, two or more gate electrodes may be disposed between the source and drain regions. In this case, the same signal is applied to those two or more gates electrodes. In the case where the dual gate (double gate) structure or the triple gate structure is employed, the resultant TFT has a less leakage current at junctions between the channel and the source and drain regions, and thus the current in the off-state can be reduced. If at least one gate electrode of these is formed to have the LDD or offset structure, the current in the off-state is further reduced, and thus it is possible to realize high-performance and high-reliability switching elements.

In general, if the semiconductor layer 1a made of the polysilicon layer including the channel region 1a', the lightly doped source region 1b, and the lightly doped drain region 1c is illuminated with light, a photocurrent is generated due to the photoelectric conversion effect of the polysilicon film. Such a photocurrent results in degradation in the transistor characteristics of the TFT 30. In the present embodiment, because the data line 6a is formed of an opaque thin metal film such as Al so that the scanning line 3a is covered with the data line 6a, at least the channel region 1a' and the LDD regions 1b and 1c of the semiconductor layer 1a are effectively prevented from being exposed to incident light. Furthermore, as described above, the first light blocking film 11a is disposed under each pixel switching TFT 30 so that at least the channel region 1a' and the lightly doped source regions 1b and the lightly doped drain region 1c of the semiconductor layer 1a are effectively prevented from being exposed to reflected light.

Furthermore, in the present embodiment, the first light blocking film 11a is electrically connected to a constant voltage source so that the first light blocking film 11a is maintained at a constant voltage. Therefore, the voltage variation of the first light blocking film 11a does not exert an adverse effect on the pixel switching TFTs 30 disposed at locations corresponding to the first light blocking film 11a. As for the constant voltage source for the above purpose, various voltage sources are available. They include a negative power supply that supplies a voltage to peripheral circuits (such as a scanning line driving circuit, data line driving circuit, sampling circuit) to drive the liquid crystal apparatus, a constant voltage source such as a positive power supply, a ground voltage source, and a constant voltage source that supplies a voltage to the opposite electrode 21. In this specific embodiment, the first light blocking film 11a is connected to the negative power supply of the scanning line driving circuit. By employing a power supply in the peripheral circuits, it becomes possible to maintain the first light blocking film 11a at a constant voltage without having to provide an additional dedicated voltage wiring or an external input terminal. If the first interlayer insulating film 12 has a large enough thickness, the first light blocking film may be produced into the form of a plurality of islands corresponding to the respective pixels and they may be electrically floated.

Referring now to FIGS. 4 to 7, input/output wirings and peripheral wirings in the peripheral circuits of the liquid crystal apparatus are described below.

Figure 4:
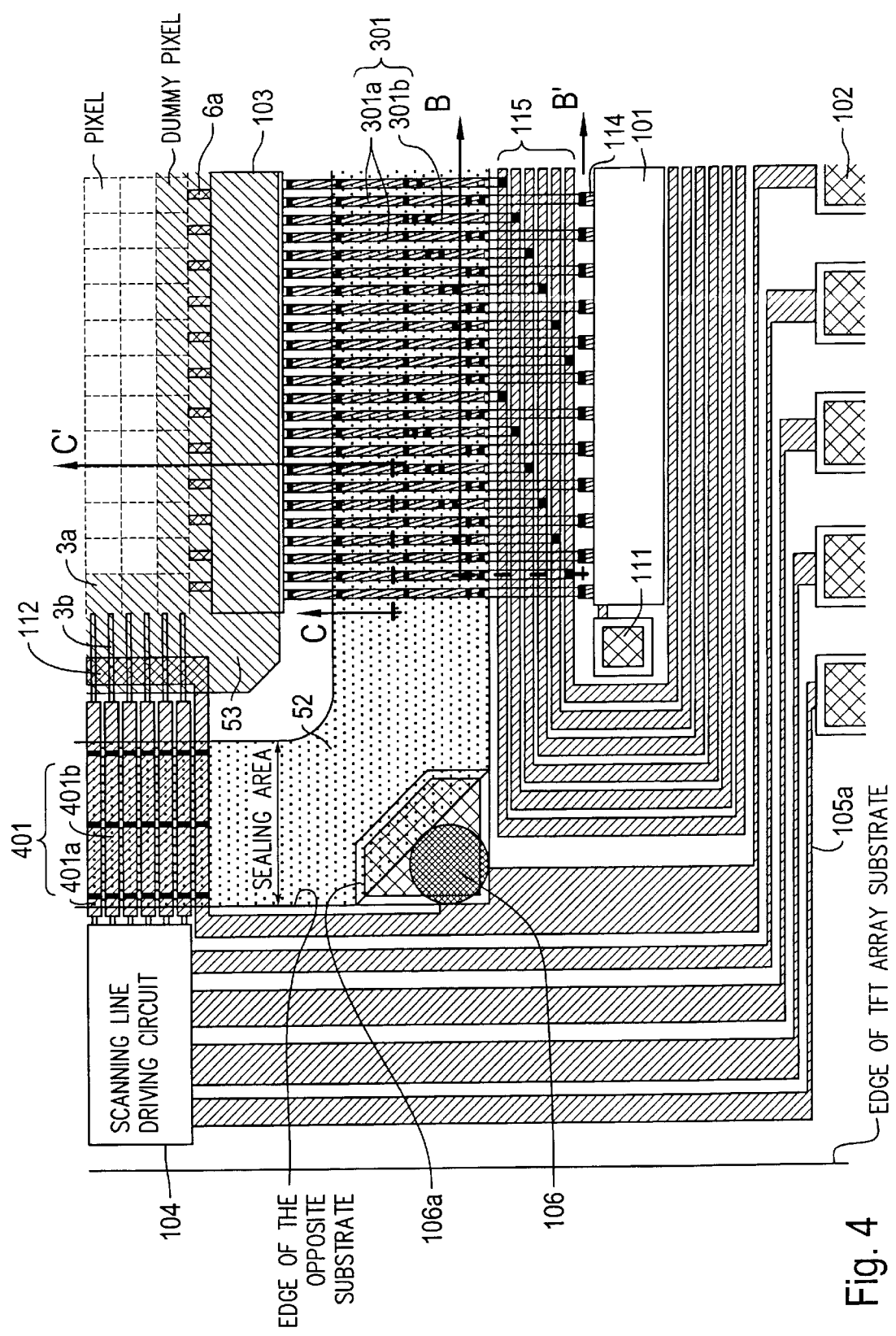
FIG. 4 is a fragmentary plan view of a TFT array substrate on which peripheral wirings are formed.
Figure 5:
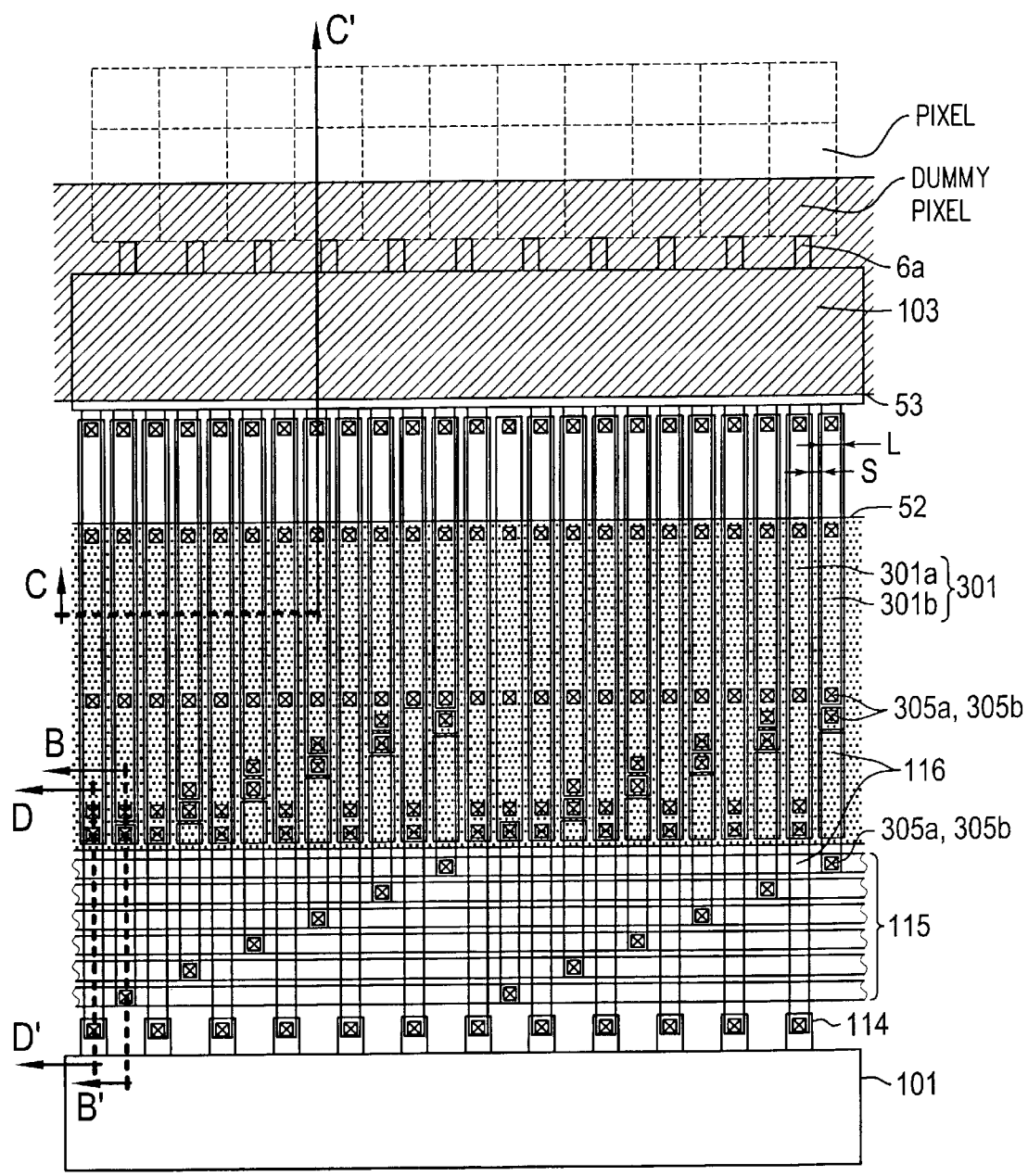
FIG. 5 is an enlarged plan view illustrating in an enlarged fashion the interconnecting lines and the leading wirings shown in FIG. 4.
Figure 6:
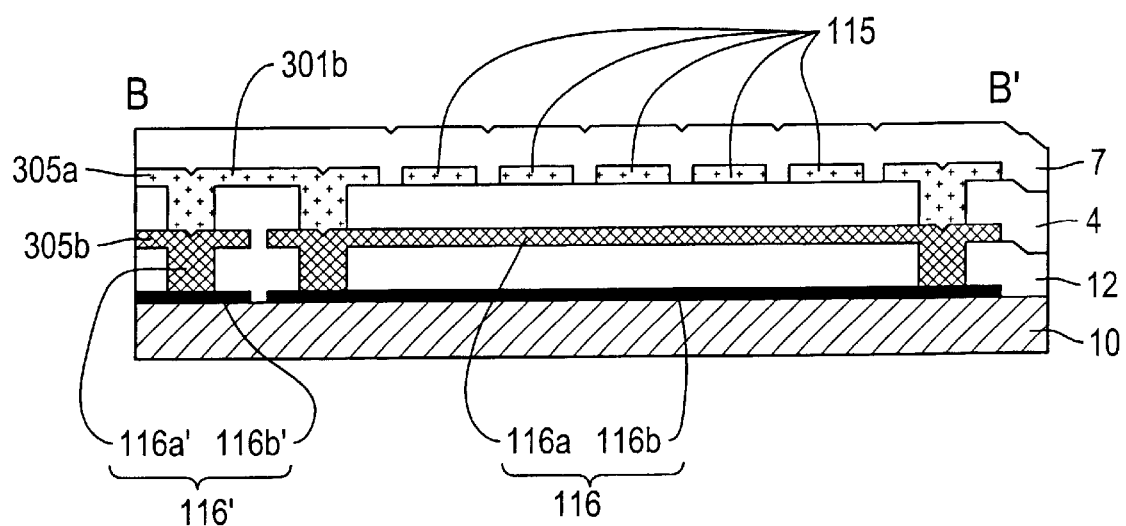
FIG. 6 is a cross-sectional view taken along plane B-B' of FIGS. 4 and 5.
Figure 7:
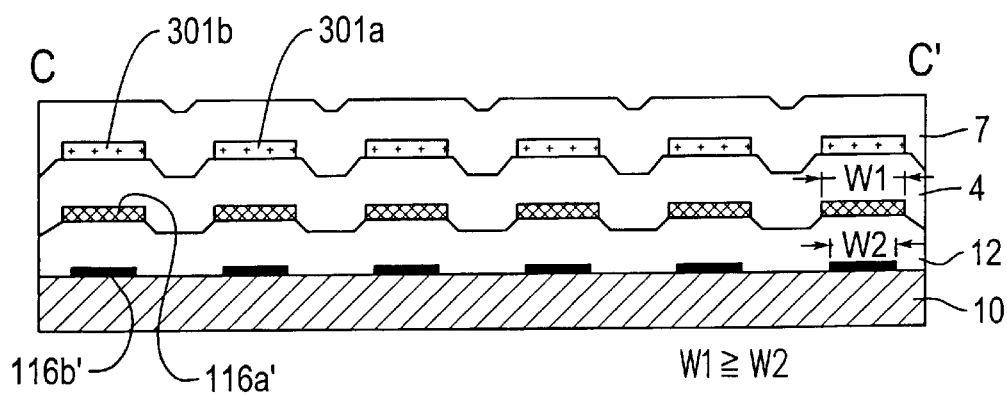
FIG. 7 is a cross-sectional view taken along plane C-C' of FIGS. 4 and 5.

FIG. 4 is a fragmentary plan view of a TFT array substrate on which peripheral wirings are formed. FIG. 5 is an enlarged plan view illustrating in an enlarged fashion the interconnecting lines and the leading wirings shown in FIG. 4. FIG. 6 is a cross-sectional view taken along plane B-B' of FIGS. 4 and 5. FIG. 7 is a cross-sectional view taken along plane C-C' of FIGS. 4 and 5.

In FIG. 4, scanning line driving signal lines 105a extend to the scanning line driving circuit 104 from the external connection terminals 102 provided in the peripheral area of the TFT array substrate 10. A plurality of image signal lines 115 are disposed along the scanning lines in an area between the data line driving circuit 101 and the sealing area where the sealing material 52 is disposed.

As shown in FIGS. 4 and 5, the sampling circuit 103 is disposed in the area inside the sealing area and under the third light blocking film 53 (denoted by the hatching lines slanted to right in the figures) which is disposed on the opposite substrate 20, so as to serve as a partition for defining the boundary between the image displaying area and the outer area. In a part of the sealing area where extensions of the data lines 6a extend, there are provided leading wirings 301 including leading wirings 301a of the sampling circuit driving signal lines 114 extending from the data line driving circuit 101, and also including leading wirings 301b of the image signal lines 115. On the other hand, in a part of the sealing area where extensions of the scanning lines 3a extend, there are provided leading wirings 401a of the scanning lines 3a extending from the scanning line driving circuit 104. The leading wirings 401 may include an opposite electrode (common electrode) voltage line 112 disposed at an end of the lead wirings 401 and the leading wirings 401b of the capacitance line 3b. The opposite electrode (common electrode) voltage line 112 is connected to the opposite common electrode 21 (refer to FIG. 3) formed on the opposite substrate 20 via the layer-to-layer conducting terminal 106a and the layer-to-layer conducting element 106. Alternatively, the opposite electrode (common electrode) voltage line 112 may be disposed at a location adjacent to a test terminal 111 through which a predetermined test signal is input to the data line driving circuit 101 and adjacent to the data line driving circuit 101.

As shown in a cross-sectional view in FIG. 6 taken along plane B-B' of FIG. 5, image signal lines 115, which are examples of peripheral wirings and leading wirings 301b, are formed using a single metal film (third conductive film) such as an Al film, which is produced in the same process for producing the data lines 6a. The interconnecting lines 116, which extend from the image signal lines 115 to the leading wirings 301b, are formed in the two-layer structure when viewed in the thickness direction of the TFT array substrate, wherein one layer is realized with the second conductive film 116a, which is made of the same film as the polysilicon film used to form the scanning line 3a, and which is electrically connected via the contact hole 305a to the corresponding image signal line 115, and the other layer is realized with the first conductive film 116b, which is made of the same film as the first light blocking film 11a, and which is electrically connected via the contact hole 305b to the corresponding interconnecting line 116a. In order to further reduce the resistance of the leading wirings 301b, the leading wirings 301b may be coupled with the second conductive film 116a' and the first conductive film 116b'.

In this structure, the resistance of the interconnecting lines 116 is reduced by the existence of the first conductive film 116b with electrical conductivity compared with the conventional interconnecting line formed of a single layer of polysilicon. More specifically, because the first conductive line 116b is formed of a refractory metal film with electrical conductivity including Ti, Cr, W, Ta, Mo, or Pb, the overall resistance of the interconnecting lines, measured along the wirings, is dominated by the sheet resistance of the first conductive film 116b. In the case of the polysilicon film, when the thickness is, for example 300 nm, the sheet resistance is about 25 Ω/□. If such a polysilicon film is used in a small liquid crystal apparatus with a width across corner of 1.3 or 0.9 inches, the wiring has a resistance of 100 KΩ to 200 KΩ, and thus the wiring has a time constant of about a few ten μsec. If the sheet resistance is reduced using the first light blocking film, it is possible to reduce the time constant of the wiring to a few μsec. If the thickness of the first conductive film 116b is 200 nm, the sheet resistance can be reduced to approximately 10 Ω/□. As a result, voltage fluctuations, crosstalk, ghosts generated by the capacitive coupling between the image signal lines 115 and the interconnecting lines 116 passing under the image signal lines 115 can be reduced. When the liquid crystal apparatus is constructed into the type of XGA or SXGA which requires a high driving frequency, the number (N) of serial-parallel conversion phases or the number (N) of image signal lines can be increased without causing a significant increase in the voltage fluctuation, crosstalk, and ghosts, because the overall time constant of the image signal lines 115 including the interconnecting lines 116 is small enough.

Furthermore, as shown in FIG. 6, the interconnecting lines 116 have a redundant structure in which, even if either the second conductive film 116a or the first conductive film 116b is broken due a foreign particle or for another reason, the electrical conduction is still maintained via the other film. Furthermore, even if the second conductive film 116a and the first conductive film 116b are short-circuited with each other via a path formed through the first interlayer insulating film 12, such a path does not result in a fatal failure. Thus, according to the present embodiment, it is possible to realize a high-reliability liquid crystal apparatus capable of displaying a high-quality image, which can be produced with high production yield. Since the first conductive film 116b can be formed in the same process as that of forming the first conductive film 11a, it is possible to reduce the resistance of the interconnecting line 116 without increasing the process.

Furthermore, as shown in FIGS. 6 and 7, the leading wirings 301b from the image signal line 115 under the sealing area are formed into a three-layer structure in which the second conductive film 116a' and the third conductive film 116b' serve as redundant wirings. This structure allows the wiring to have an extremely low resistance. Furthermore, as shown in FIG. 5, three layers are electrically connected to one another via contact holes 305a and contact hole 305b at a plurality of locations under the sealing area thereby achieving high-degree redundancy. Thus the leading wirings 301b have extremely high reliability. Alternatively, either one of the second conductive film 116a' or the third conductive film 116b' may be employed as a redundant wiring so as to obtain a two-layer wiring structure, which can provide similar effects and advantages. The leading wirings 301a of the sampling circuit driving signal lines 114 may also be formed into a similar two- or three-layer wiring structure.

On the other hand, as shown in FIG. 4, the leading wirings 401 of the scanning line side extending along the scanning lines 3a and adjacent leading wirings are spaced from each other. The leading wirings 401 are made of the same polysilicon film as that used to form the scanning lines 3a. Dummy wirings made of the same Al film as that of the data lines 6a are provided above the respective leading wirings 401. Although the resistance of the leading wirings 401 extending along the scanning lines 3a is not important in many cases, the leading wirings 401 extending along the scanning lines 3a may also be formed into a two-layer or three-layer wiring structure similar to that of the leading wirings 301 of the data lines 6a.

In the sealing area, as described above, there are great number of wirings with the multilayer structure along the periphery around the liquid crystal layer 50, wherein the multilayer structure includes various layers disposed one on another in the thickness direction of the TFT array substrate 10, such as the first conductive film 116b, 116b', the second conductive film 116a, 116a', the third conductive film(A1), the first interlayer insulating film 12, the second interlayer insulating film 4, and the third interlayer insulating film 7. In this structure, the height of the surface of the third interlayer insulating film 7 on the upper and lower sides of the image displaying area in the sealing area is coincident with the height of the surface of the third interlayer insulating film 7 on the left and right sides of the image displaying area. This allows a reduction in the variation in the gap, including the effects of various thin films, between the two substrates over the entire sealing area. Thus, it becomes possible to more precisely control the gap of the liquid crystal cell when the gap is controlled by the sealing material containing gap materials with a particular diameter. In particular, in this structure, even if some leading wiring 301 extending along the data lines or 401 extending along the scanning lines is broken by the stress in the gap materials in the sealing area, such a breakage or a short-circuiting path does not result in a fatal wiring failure.

In the case where the precise gap control is important, the second conductive film 116a' and the first conductive film 116b' are not electrically connected to the leading wirings 301b as opposed to FIG. 6, but the second conductive film 116a' and the first conductive film 116b' may be used as dummy wirings dedicated to the purpose for controlling the gap between the gap.

In the present embodiment, as shown in FIG. 5, the leading wirings 301 are disposed in the form of stripes in a plane in the sealing area and gaps S are formed between adjacent wirings so that light is allowed to pass through these gaps. Therefore, when a photo-curing resin is employed as the sealing material 52, if the TFT array substrate 10 is exposed to light, the sealing material 52 is well illuminated with light via the light transmission gaps formed in the multilayer structure. Thus, the photo-curing resin serving as the sealing material 52 is well photo-cured with light coming through both substrates. When the photo-curing process is employed, unlike the thermal curing process, the liquid crystal apparatus is not subjected to a high temperature. This prevents various elements of the liquid crystal apparatus from being degraded by heat and from having defects due to thermal strain. Furthermore, because light illumination time is short enough, the orientation films 16 and 22 (refer to FIG. 3) are not damaged. As a result, a large tilt angle of the liquid crystal is maintained and degradation in the image quality due to orientation defects (disclination) of the liquid crystal does not occur.

In FIGS. 4 and 5, dummy pixels, having the same structure as that of the pixels formed in the image displaying area, are formed under the third light blocking film 53 serving as a peripheral partition film. Although pixels used to display an image are not required under the third light blocking film 53 serving to hide orientation failures of the liquid crystal, dummy pixels may be disposed in an area with a particular width outside the image displaying area so that the characteristics of the pixels near the edge of the image displaying area are stabilized.

Furthermore, in the present embodiment, the interconnecting lines 116 are preferably formed into such a structure that the second conductive film 116a made of the light blocking film is covered with the first conductive film 116b, 116b' made of the polysilicon film when viewed from the opposite substrate side. More specifically, for example, in FIG. 7, the wiring width W1 of the second conductive film 116a' is preferably set to a value equal to or greater than the wiring width W2 of the first conductive film 116b', that is W1≧W2, in the area under the image signal lines 115 shown in FIG. 6 and in the sealing area shown in FIG. 7. In this structure, the increase in the capacitive coupling between the first conductive film 116b and the image signal lines 115 in FIG. 6 is suppressed, and thus the increase in the time constant associated with the image signal lines 115 and the interconnecting lines 116 caused by the capacitive coupling is suppressed. In particular, at crossing points, the second conductive film 116a is disposed between the first conductive film 116b and the image signal line 115, and the first conductive film 116b is spaced from the image signal line 115 by a relatively large distance, and thus the increase in the capacitive coupling is minimized.

Figure 8:
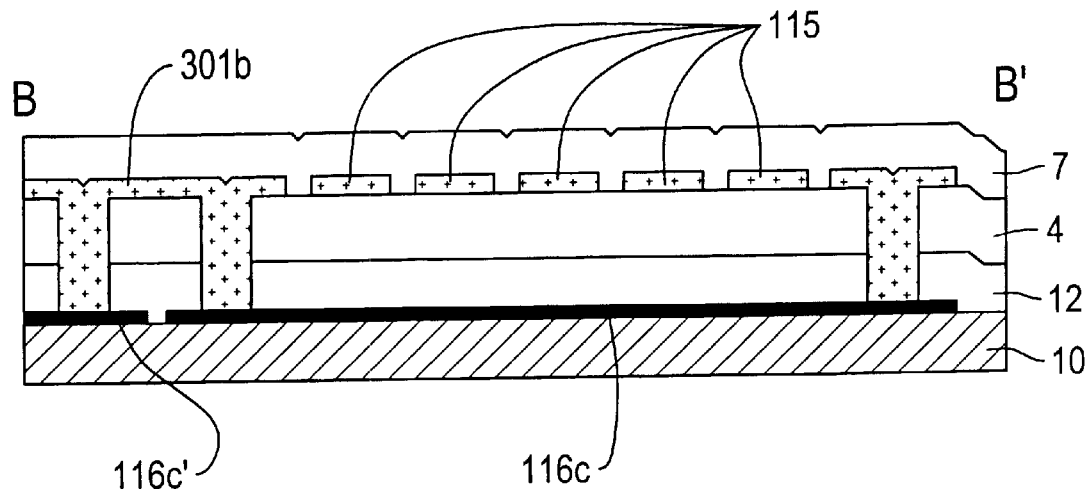
FIG. 8 is a cross-sectional view illustrating an alternative structure in cross-section taken along phase B-B' of FIGS. 4 and 5.
Figure 9:
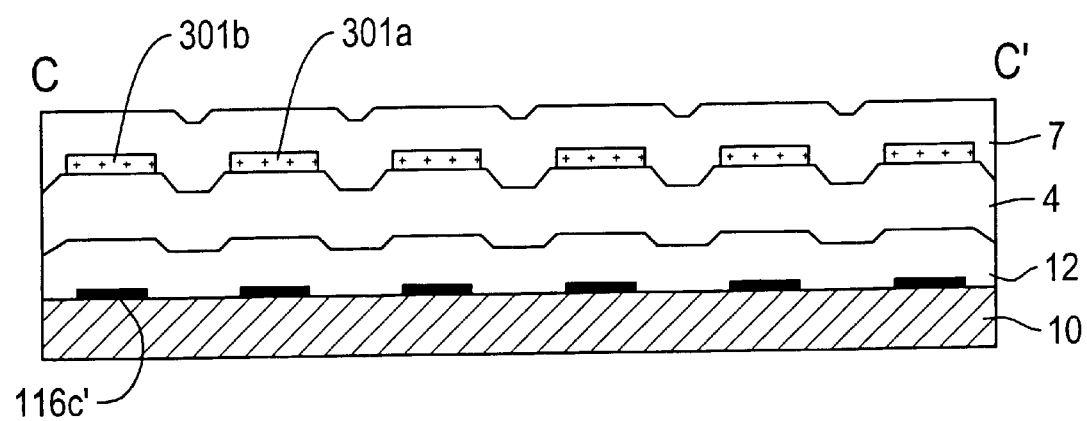
FIG. 9 is a cross-sectional view illustrating an alternative structure in cross-section taken along plane C-C' of FIGS. 4 and 5.

Although the interconnecting lines shown in FIGS. 6 and 7 have a two-layer wiring structure that includes the second conductive film 116a and the first conductive film 116b, the second conductive film 116a or 116a' may be removed from the two-layer wiring structure shown in FIGS. 6 and 7, so that the interconnecting lines have a single-layer wiring structure that includes the first conductive film 116a made of the light blocking film, as shown in FIGS. 8 and 9. Although this structure does not have the advantages of the redundant structure, the structure has another advantage that the capacitance between the image signal line 115 and the first conductive film 116a under the image signal line 115 shown in FIG. 6 become smaller by an amount caused by the existence of the first interlayer insulating film 12 compared with the case where the interconnecting lines 116 are formed of the second conductive film 116a existing between the first interlayer insulating film 12 and second interlayer insulating films 4.

On the other hand, in FIGS. 4 and 5, because the image signal lines 115 are made of the Al film formed on the second interlayer insulating film 4, the third conductive film (Al) film cannot be employed to form the sampling circuit driving signal lines 114 extending from the data line driving circuit 101 to the leading wirings 301a and crossing the image signal lines 115, as in the case of the interconnecting line 116 shown in FIGS. 6 and 8. Therefore, the sampling circuit driving signal lines 114 need a three-dimensionally crossing interconnecting line which passes under or above the image signal lines 115. It is desirable that the interconnecting lines have as small a time constant as possible. This can be achieved in various ways as described below.

Figure 10:
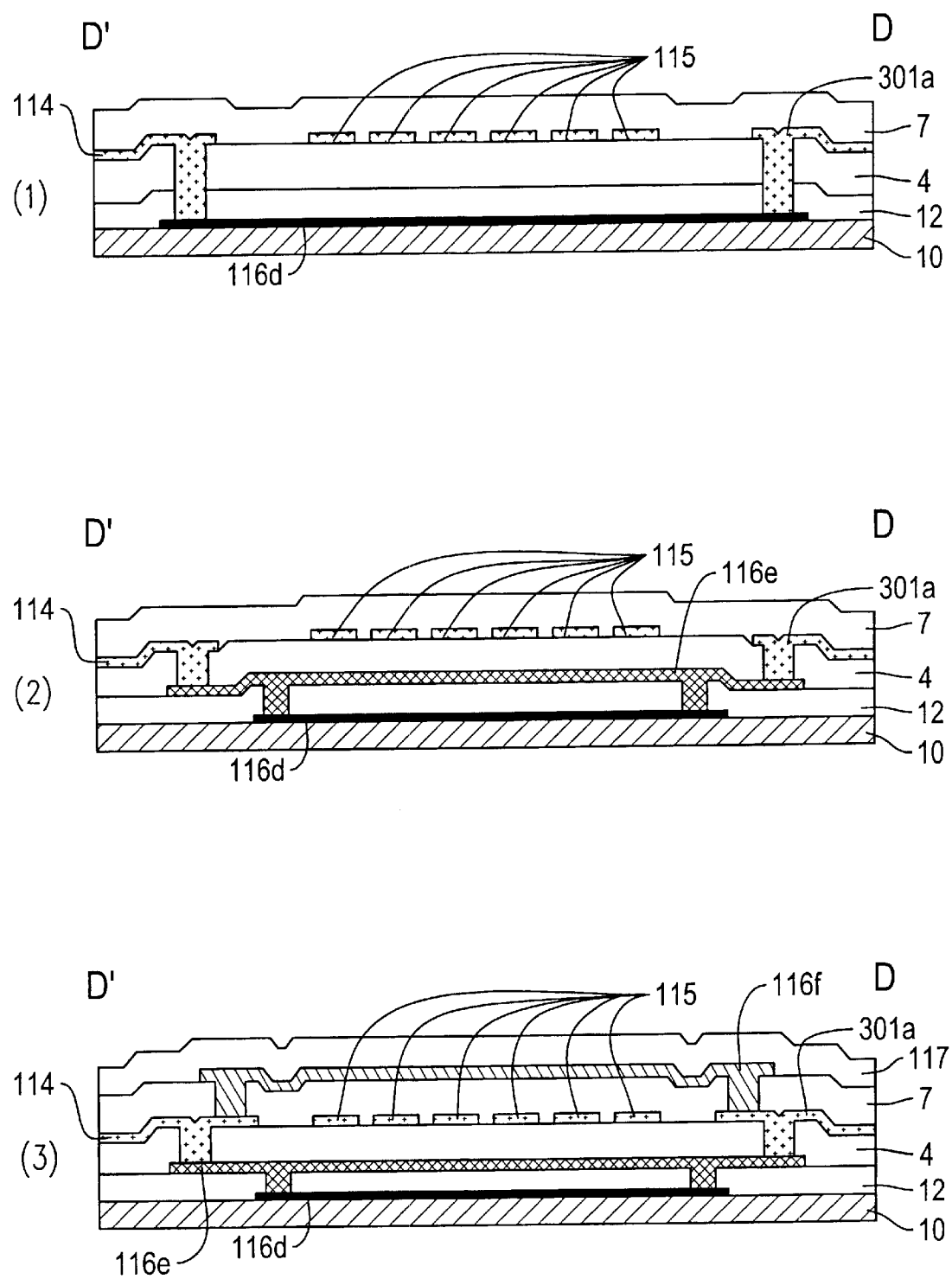
FIG. 10 is a cross-sectional view illustrating various embodiments of interconnecting lines of a sampling circuit driving signal line, taken along plane D-D' of FIG. 5.

FIGS. 10(1) to 10(3) are cross-sectional views taken along the plane D-D' of FIG. 5.

In FIG. 10 step (1), the first conductive film 116d is made of the same refractory metal film such as W (tungsten) or metal alloy film as that used to form the first light blocking film 11a, and is passed under the second interlayer insulating film 4 such that it crosses the image signal lines 115. The interconnecting line 116e is electrically connected to the sampling circuit driving signal line 114 located at the side of the data line driving circuit 101 and to the leading wiring 301a at the side of the sealing area, via contact holes formed, at both sides of the image signal lines 115 in the figure, in the first interlayer insulating film 12 and the second interlayer insulating film 4. In this structure, the interconnecting line is made of refractory metal with a low resistance, and thus the wiring has a low enough resistance that causes no delay in propagation of the image signal.

In FIG. 10 step (2), the interconnecting line includes a second conductive film 116e made of the same polysilicon film as that used to form the scanning lines 3a and also includes a first conductive film 116d made of the same refractory metal film such as W or metal alloy film as that used to form the light blocking film 11a, wherein they are passed under the second interlayer insulating film 4 and under the first interlayer insulating film 12, respectively, such that they cross the image signal lines 115. The interconnecting line is electrically connected to the sampling circuit driving signal line 114 located at the side of the data line driving circuit 101 and to the leading wiring 301a at the side of the sealing area, via contact holes formed, at both sides of the image signal lines 115 in the figure, in the first interlayer insulating film 12 and the second interlayer insulating film 4. In this structure, the first conductive film 116d and the second conductive film 116e are formed below the image signal lines 115 via the first interlayer insulating film 12 and the second interlayer insulating film 4, and thus a more redundant structure is realized. Furthermore, because the first conductive film 116d is made of a refractory metal film or metal alloy film with a low resistance, the overall wiring resistance becomes lower, and thus no delay occurs in propagation of the image signal. Although in the present embodiment, the first conductive film 116d and the second conductive film 116e are electrically connected to each other in a direct fashion, the first conductive film 116d and the sampling circuit driving signal line 114 or the leading wiring 301a at the side of the sealing area may be electrically connected to each other.

In FIG. 10 step (3), the interconnecting line includes, in addition to the first conductive film 116d and the second conductive film 116e formed in substantially the same manner as the interconnecting lines having redundancy shown in FIG. (3), an fourth conductive film 116f formed on the third interlayer insulating film 7 using the same film as the refractory metal film or metal alloy film employed as the light blocking film with electrical conductivity which defines at least a part of pixel opening area. This fourth conductive film 116f extends so that it crosses the image signals 115. A fourth interlayer insulating film 117 is formed on the fourth conductive film 116f. The fourth conductive film 116f is electrically connected to the sampling circuit driving signal line 114 located at the side of the data line driving circuit 101 and to the leading wiring 301a at the side of the sealing area, via contact holes formed, at both sides of the image signal lines 115 in the figure, in the third interlayer insulating film 7. In this structure, three layers of the first conductive film 116d, the second conductive film 116e, and the fourth conductive film 116f are formed above and below the image signal lines 115 via the first interlayer insulating film 12, the second interlayer insulating film 4, and the third interlayer insulating film 7, and thus a still more redundant structure is achieved. Furthermore, because the interconnecting lines 116h and 116j are made of a refractory metal film or metal alloy film with a low resistance, the overall wiring resistance becomes still lower, and thus no delay occurs in propagation of the image signal.

In the present embodiment, as described above, the interconnecting lines 116 of the image signal lines 115 and of the sampling circuit driving signal lines are formed into the two-layer or single-layer structure having a reduced resistance using the first conductive film formed in the same process as the first light wiring film 11a. However, the application of the interconnecting line according to the invention is not limited such an image signal line 115 and sampling circuit driving signal line 114. For example, in peripheral circuits, such as a data line driving circuit 101, scanning line driving circuit 104, and sampling circuit 103, it is also possible that an arbitrary interconnecting line, in the peripheral circuits, formed of a polysilicon film in the same process as that of forming the scanning line 3a at a crossing point where two Al wirings cross each other may be converted into a two-layer structure having a low resistance using the light blocking film. Alternatively, the interconnecting line made of a polysilicon film may be replaced with a single-layer wiring having a low resistance made of the light blocking film. In particular, the reduction in the resistance of the interconnecting lines used in the data line driving circuit or the scanning line driving circuit results in a reduction in the delay of shift registers used in these circuits, and thus it becomes possible to increase the driving speed. The reduction in the resistance of the interconnecting lines in the sampling circuit or the precharging circuit makes it possible to prevent the sampling circuit driving signal and the precharging circuit driving signal from becoming less sharp. This makes it possible to write an image signal in a desirable fashion so as to achieve an improvement in the image quality. The interconnecting lines may also be formed into a structure that includes three or more layers of conductive films.

Process of Producing Liquid Crystal Apparatus

Figure 11:
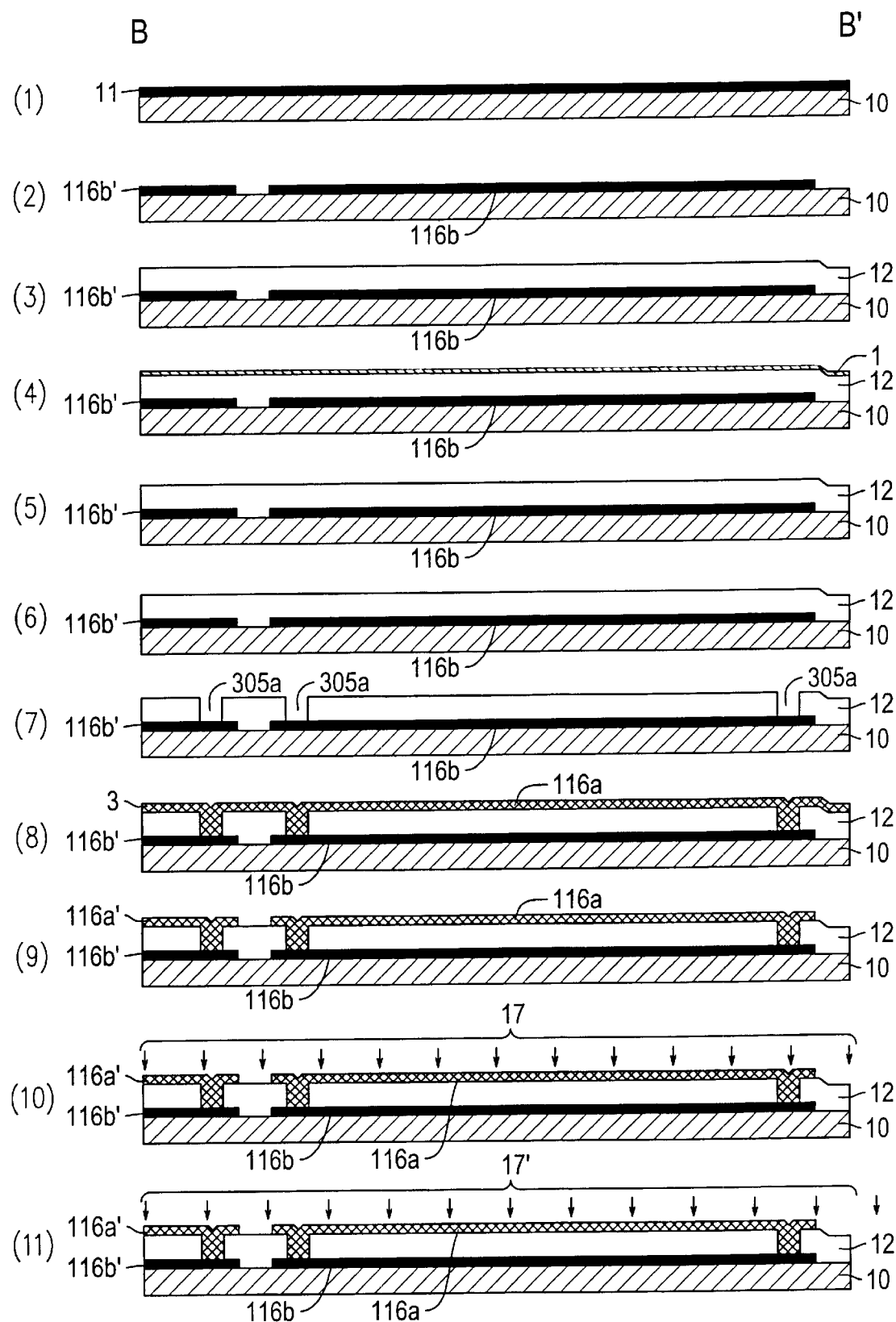
FIG. 11 is a cross-sectional view illustrating processing steps of producing a liquid crystal apparatus according to an embodiment of the invention, wherein a cross-section corresponding to that shown in FIG. 6 is shown for various processing steps.
Figure 12:
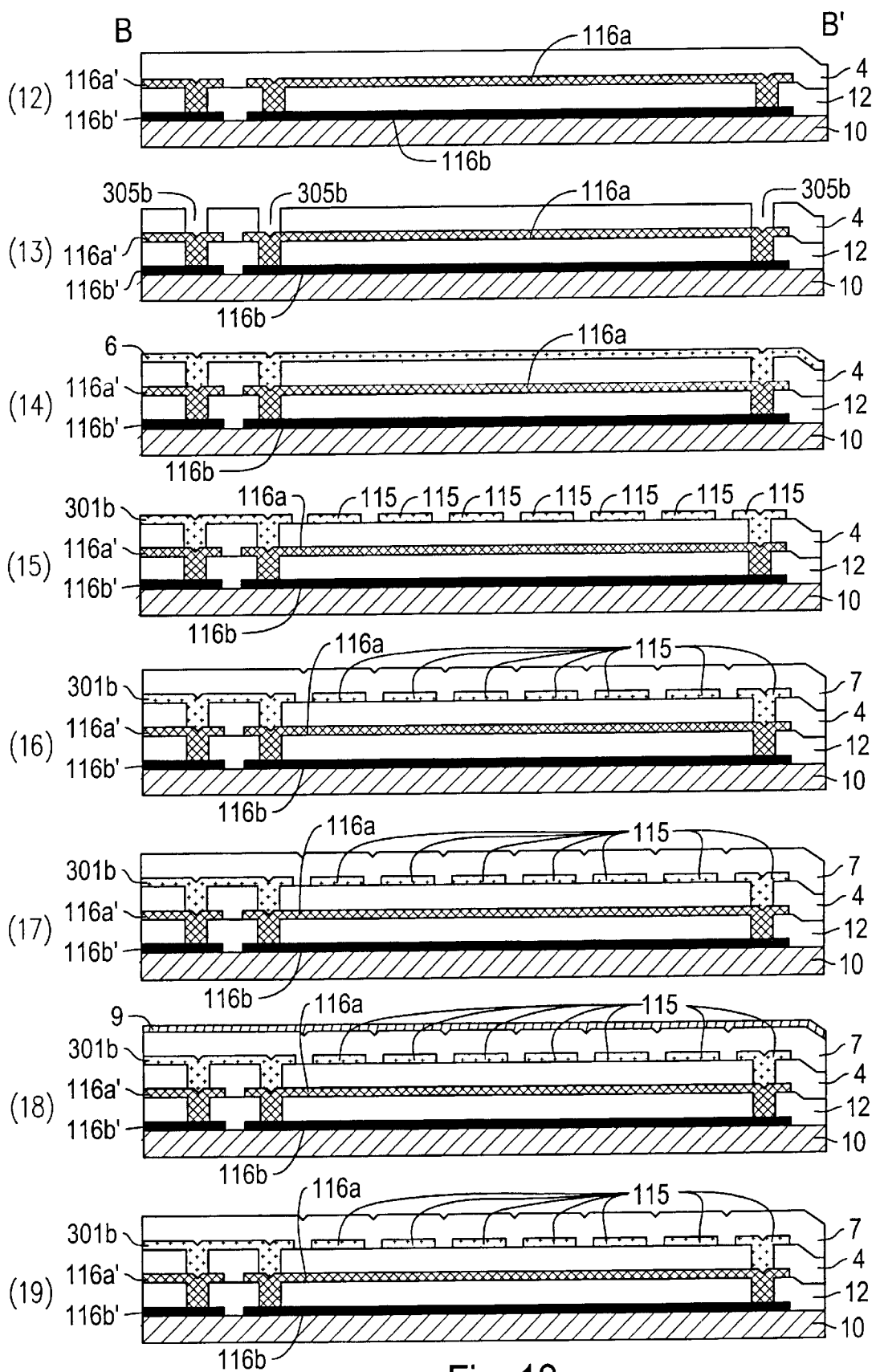
FIG. 12 is a cross-sectional view illustrating processing steps of producing a liquid crystal apparatus according to an embodiment of the invention, wherein the cross-section corresponding to that shown in FIG. 6 is shown for various processing steps.
Figure 13:
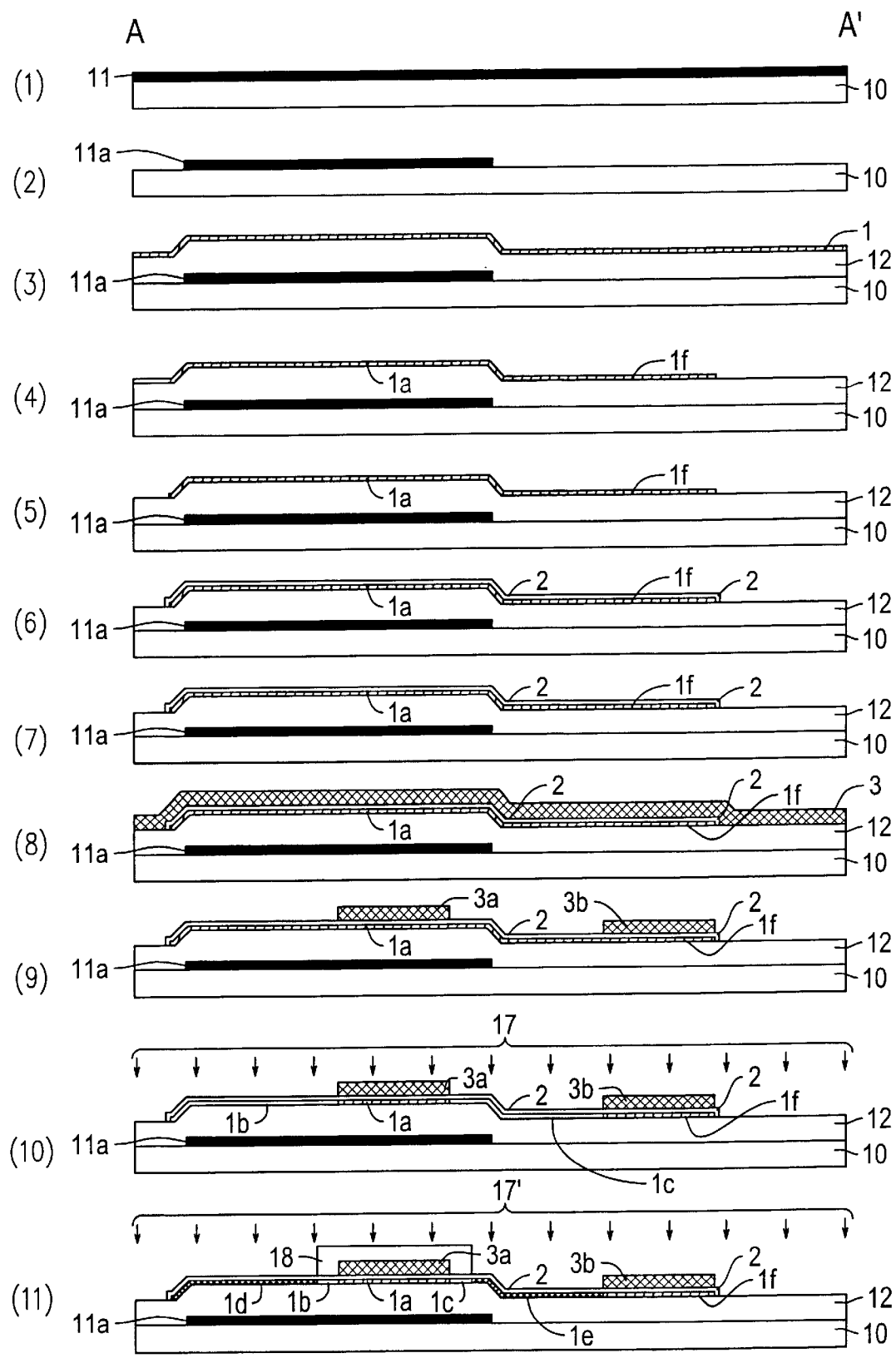
FIG. 13 is a cross-sectional view illustrating processing steps of producing a liquid crystal apparatus according to an embodiment of the invention, wherein a cross-section corresponding to that shown in FIG. 3 is shown for various processing steps.
Figure 14:
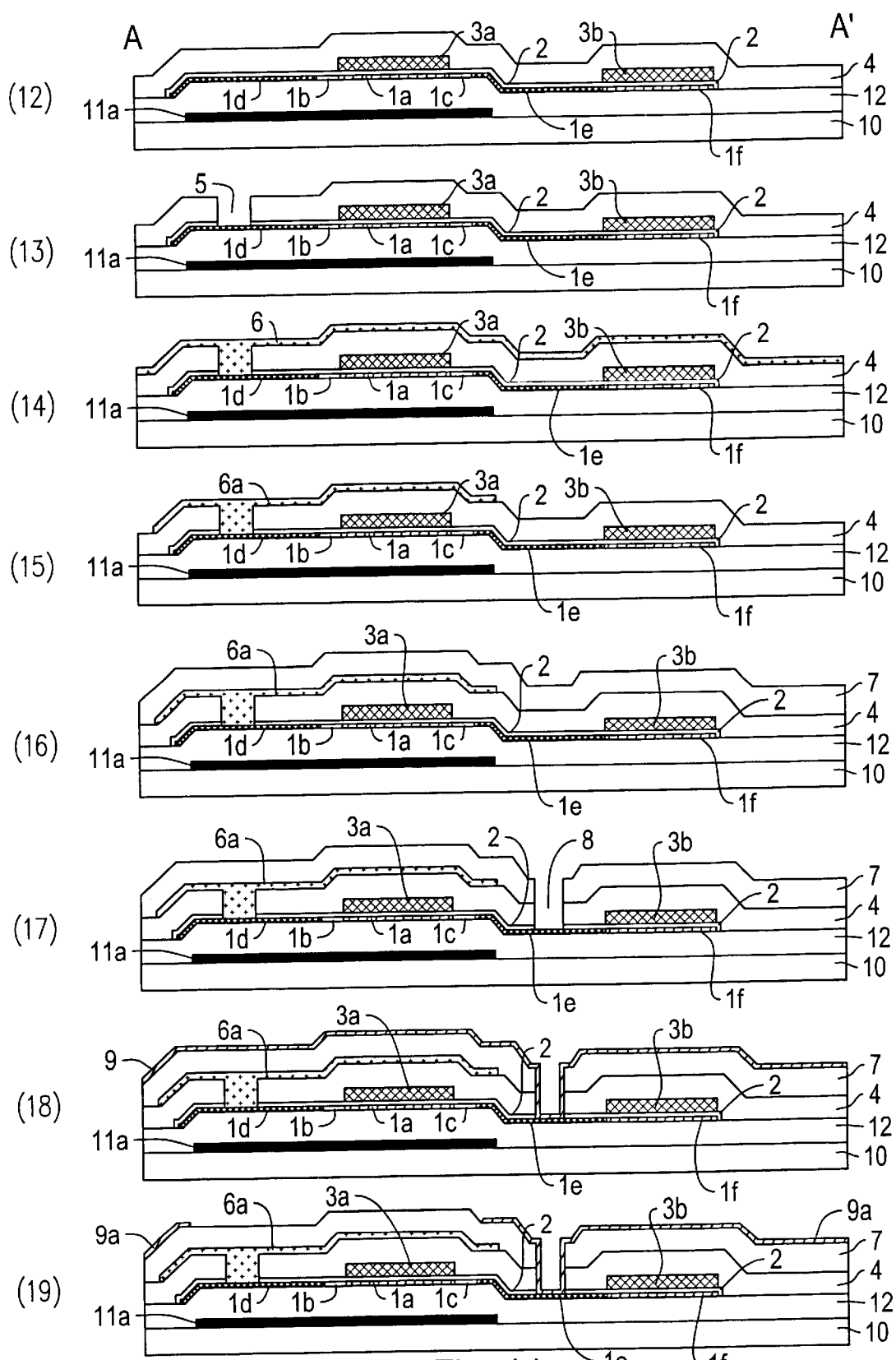
FIG. 14 is a cross-sectional view illustrating processing steps of producing a liquid crystal apparatus according to an embodiment of the invention, wherein the cross-section corresponding to that shown in FIG. 3 is shown for various processing steps.

Referring now to FIGS. 11 to 14, a process of producing the liquid crystal apparatus with the above-described structure according to an embodiment of the invention is described below. FIGS. 11 and 12 are cross-sectional views taken, as in FIG. 6, along plane B-B' of FIG. 4, and illustrating various layers on the TFT array substrate for the respective processing steps. FIGS. 13 and 14 are cross-sectional views taken, as in FIG. 3, along plane A-A' of FIG. 2, and illustrating various layers on the TFT array substrate for the respective processing steps. The structure shown in the B-B' cross section and the structure shown in the C-C' cross section are both produced at the same time during the same process. Therefore, the processing steps are described below in parallel for both structures.

In step (1) shown in FIGS. 11 and 13, a quarts substrate, a hard glass substrate, or a substrate of another proper material for use as a TFT array substrate 10 is prepared. Preferably, the TFT array substrate 10 is annealed at a high temperature of about 900° C. to 1300° C. in an ambient of inert gas such as $N_2$ (nitrogen) so that the TFT array substrate 10 will have less strain in a high-temperature process which will be performed later. To this end, the TFT array substrate 10 is subjected to a heat treatment at a proper temperature equal to or higher than the highest temperature that the TFT array substrate 10 will encounter in the following production process.

After the heat treatment, a film of metal, such as Ti, Cr, W, Ta, Mo, or Pb, or a metal alloy, such as a metal silicide, is deposited on the TFT array substrate 10 over an entire surface thereof by means of sputtering, thereby forming a light blocking film 11 with a thickness of 100 to 500 nm, and more preferably with a thickness of about 200 nm.

After that, in step (2) shown in FIG. 13, a resist mask having a pattern corresponding to the pattern of a first light blocking film 11a (refer to FIG. 2), that shields pixel TFTs from light, is formed on the light blocking film 11 by means of a photolithography process. The light blocking film 11 is then etched via the resist mask, thereby forming the first light blocking film 11a.

At the same time, as shown in step (2) in FIG. 11, a resist mask having a pattern corresponding to the pattern on a interconnecting line 116 and a leading wiring 301b is formed on the light blocking film 11 by means of the photolithography process, and the light blocking film 11 is etched via the resist mask thereby forming first conductive films 116a and 116b'.

Subsequently, as shown in step (3) in FIGS. 11 and 13, a silicate glass film, such as NSG, PSG, BSG or BPSG, a silicon nitride film, or a silicon oxide film, is formed on the first light blocking films 11a and the first conductive film 116 by means of, for example an atmospheric-pressure or low-pressure CVD technique using TEOS (tetraethyl orthosilicate) gas, TEB (tetraethyl borate) gas, or TMOP (tetramethyl oxyphosrate) gas, thereby forming a first interlayer insulating film 12. The thickness of the first interlayer insulating film 12 is selected to a value, for example within the range from about 500 to 2000 nm.

In the next step (4), as shown in FIGS. 11 and 13, an amorphous silicon film is formed on the first interlayer insulating film 12 at a relatively low temperature of about 450 to 500° C., and more preferably at about 500° C. by means of a low-pressure CVD technique (for example at a pressure of about 20 to 40 Pa) using mono-silane gas or a disilane gas at a flow rate of about 400 to 600 cc/min. After that, annealing is performed in an ambient of nitrogen at about 600 to 700° C. for about 1 to 10 hours, and more preferably for 4 to 6 hours so that a polysilicon film 1, with a thickness of about 50 to 200 nm, and more preferably about 100 nm, is formed by means of a solid phase growth process.

In the case where n-channel TFTs are employed as the pixel switching TFTs 30 shown in FIG. 3, a V-group element such as Sb (antimony), As (arsenic), or P (phosphorus) may be slightly doped into the channel region of each TFT 30 by means of ion implantation or the like. On the other case, when p-channel TFTs are employed as the pixel switching TFTs 30, a III-group element such as B (boron), Ga (gallium), or In (indium) may be slightly doped by means of ion implantation or the like. The polysilicon film 1 may also be formed indirectly by means of a low-pressure CVD process or the like without forming an amorphous silicon film as an intermediate film. Still alternatively, after depositing a polysilicon film by means of a low-pressure CVD process or the like, silicon ions may be implanted so as to convert the film into an amorphous state, and then the film may be recrystallized by means of annealing, thereby forming the polysilicon film 1.

In the next step (5) as shown in FIG. 13, a semiconductor layer 1*a* with a pattern such as that shown in FIG. 2 is formed by means of a photolithography process and an etching process. In this process, a first storage capacitor electrode 1*f* extending from the semiconductor layer 1*a* of the pixel switching TFT 30 is also formed in an area where a capacitance line 3*b* is to be formed along a scanning line 3*a*.

In the next step (6) shown in FIG. 13, the semiconductor layer 1*a* of the pixel switching TFT 30 and the first storage capacitor electrode 1*f* are thermally oxidized at a temperature of about 900 to 1300° C., and more preferably at about 1000° C., thereby forming a thermal silicon oxide film with a relatively small thickness such as about 300 Å. Furthermore, a high-temperature silicon oxide (HTO) film or a silicon nitride film with a relatively small thickness, such as about 50 nm, is deposited by means of, for example, a low-pressure CVD process, thereby forming an insulating film 2 used as the gate insulating film of the pixel switching TFT 30 and also as the dielectric film of the capacitor. As a result of the above process, the thickness of the semiconductor layer 1*a* becomes about 30 to 150 nm, and more preferably about 35 to 50 nm, and the thickness of the insulating film 2 becomes about 20 to 150 nm, and more preferably about 30 to 100 nm. By performing the high-temperature oxidation process for a short time as described above, it is possible to prevent the substrate from being warped by heat, in particular when the substrate has a large size, such as 8 inches. Alternatively, the insulating film 2 of the gate insulating film and the dielectric film for the capacitor may also be formed into a single layer structure by performing only the process of thermally oxidizing the polysilicon layer 1.

In the step (6) In FIG. 13, although not necessarily required, for example P ions may be doped into a particular part of the semiconductor layer, which will become the first storage capacitor electrode 1*f*, to a dose of about $3 \times 10^{12}/cm^2$ so as to obtain lower resistance.

In the next step (7) in FIG. 11, contact holes 305*a* extending to the first conductive film 116*b* and 116*b'* are formed in the first interlayer insulating film 12 by means of dry etching, such as reactive ion etching or reactive ion beam etching or wet etching. Isotropic etching, such as reactive ion etching or reactive ion beam etching, has the advantage that contact holes 305*a* can be formed such that they have substantially the same shape as the mask shape. If dry etching is mixed with wet etching, it becomes possible to form contact holes 305*a* such that they have a tapered structure, which prevents the wirings from being broken.

In the next step (8) in FIG. 13, a polysilicon layer 3 is deposited by means of a low-pressure CVD process, and phosphorus (P) is doped into the polysilicon layer 3 by means of thermal diffusion thereby converting the polysilicon film 3 into an electrically conductive layer. Alternatively, P ions may be doped into the polysilicon film 3 when the polysilicon film 3 is deposited.

Then in step (9) in FIG. 13, the polysilicon film 3 is etched by means of a photolithography process and an etching process using a resist mask, thereby forming a scanning line 3*a* having a pattern such as that shown in FIG. 2 and also a capacitance line 3*b*.

At the same time in process (9) in FIG. 11, second conductive films 116*a* and 116*a'* serving as interconnecting lines 116 and interconnecting line 301*b* having a pattern, such as that shown in FIGS. 4 and 5, are formed.

In the next step (10) in FIGS. 11 and 13, when the pixel switching TFTs 30 shown in FIG. 3 are constructed into n-channel TFTs with the LDD structure, a lightly doped source region 1*b* and a lightly doped drain region 1*c* are first formed in the semiconductor layer 1*a* by doping a V-group element, such as P serving as a dopant 17 to a low concentration (for example P ions are doped to a dose of 1 to $3 \times 10^{13}/cm^2$) using the scanning line 3*a* as a diffusion mask. As a result of this process, the part of the semiconductor layer 1*a* under the scanning line 3*a* becomes a channel region 1*a'*.

Then in step (11) in FIG. 13, a resist mask layer 18 having a pattern wider than the gate electrode as a part of the scanning line 3*a* is formed over the scanning line 3*a*, and a V-group element such a P serving as a dopant 17 is doped to a high concentration (for example, P ions are doped to a dose of 1 to $3 \times 10^{15}/cm^2$) thereby forming a heavily doped source regions 1*d* and a heavily doped drain region 1*e* of the pixel switching TFT 30. On the other hand, in the case where the switching TFT 30 is formed into a p-channel type, a III-group element, such as B, is employed in the doping process to form a lightly doped source region 1*b* and the lightly doped drain region 1*c*, and also the heavily doped source region 1*d* and the heavily doped drain region 1*e* in the semiconductor layer 1*a*. The pixel switching TFT 30 may also be formed into an offset structure which will be obtained if lightly doping is not performed in the above-described process. The pixel switching TFT 30 may also be formed into a self-aligned type TFT by implanting P ions or B ions using the scanning line 3*a* as an implantation mask.

In parallel to the above-described processing steps, peripheral circuits including the data line driving circuit 101 and the scanning line driving circuit 104 are formed in the form of complementary configuration consisting of n-channel TFTs and p-channel TFTs in a peripheral area on the TFT array substrate 10. In the present embodiment, as described above, because the polysilicon TFT is employed as the pixel switching TFT 30, the peripheral circuits including the data line driving circuit 101 and the scanning line driving circuit 104 are produced at the same time during the process for producing the pixel switching TFT 30.

In the next step (12) in FIGS. 12 and 14, a silicate glass film such as NSG, PSG, BSG, or BPSG, a silicon nitride film, or a silicon oxide film serving as a second interlayer insulating film 4 is formed using an atmospheric-pressure or low-pressure CVD process with TEOS gas or the like in such a manner that the scanning lines 3*a* of the pixel switching TFTs 30 and also the capacitance lines 3*b*, the scanning lines 3*a*, and the second conductive films 116*a* and 116*a'* are covered with the second interlayer insulating film 4. Preferably, the thickness of the second interlayer insulating film 4 is within the rage from about 500 to 1500 nm.

Then in step (13) in FIGS. 12 and 14, annealing for activating the heavily doped source region 1*d* and the heavily doped drain region 1*e* is performed at 1000° C. for 20 min. After that, a contact hole 5 for the data line 6*a* is formed by means of dry etching, such as reactive ion etching or reactive ion beam etching or wet etching. A contact hole 305*b* for electrically connecting the second conductive film 116a to the leading wiring 301b are also formed in the second interlayer insulating film 4 during the process of forming the contact hole 5.

In the next step (14) in FIGS. 12 and 14, a metal film 6 is formed on the second interlayer insulating film 4 by depositing opaque low-resistance metal, such as Al or a metal silicide, to a thickness of about 100 to 500 nm, and more preferably about 300 nm for example, by using sputtering process. Then in step (15), the metal film 6 is subjected to a photolithography process and an etching process so as to form a data line 6a, an image signal line 115, and a leading wiring 301b.

In the next step (16) in FIGS. 12 and 14, a silicate glass film, such as NSG, PSG, BSG, or BPSG, a silicon nitride film, or a silicon oxide film serving as a third interlayer insulating film 7, is formed using an atmospheric-pressure or low-pressure CVD process with TEOS gas or the like in such a manner that the data lines 6a are covered with the third interlayer insulating film 7. Preferably, the thickness of the third interlayer insulating film 7 is within the range from about 500 to 1500 nm.

In the next step (17) in FIG. 14, a contact hole 8 used to electrically connecting the pixel electrode 9a to the heavily doped drain region 1e of the pixel switching TFT 30 is formed using a dry etching process such as reactive ion etching or reactive ion beam etching.

Then in step (18) in FIGS. 12 and 14, a transparent and electrically conductive thin film 9, such as an ITO film, is formed on the third interlayer insulating film 7 to a thickness of about 50 to 200 nm using, for example, a sputtering process. Furthermore, in step (19) in FIGS. 12 and 14, a pixel electrode 9a is formed using a photolithography process and an etching process. When the present liquid crystal apparatus is used in the reflection type liquid crystal device, the pixel electrode 9a may be formed of an opaque material having a high reflectivity, such as Al.

Subsequently, a polyimide-based solution serving as a material of an is coated on the pixel electrode 9a and rubbed in a particular direction at a pre-tilt angle, thereby forming an orientation film 16.

The opposite substrate 20 shown in FIG. 3 is produced as follows. First, a glass substrate or the like is prepared. A second light blocking film 23 and a third light blocking film 53 (refer to FIGS. 4 and 5) are formed by first sputtering chromium and then performing a photolithography process and an etching process. Materials which can be used to form the second light blocking film 23 and the third light blocking film 53 include metals such as Cr, Ni, and Al and a resist black that includes a photoresist containing dispersed carbon or Ti.

After that, a transparent and electrically conductive thin film, such as an ITO film, is deposited over the entire surface of the opposite substrate 20 to a thickness of about 500 to 2000 A using, for example, a sputtering process, thereby forming an opposite common electrode 21. Furthermore, a solution for a polyimide-based is coated over the entire surface of the opposite common electrode 21. The resultant film is then subjected to a rubbing process in a particular direction at a predetermined pretilt angle, thereby forming an orientation film 22.

Finally, the TFT array substrate 10 and the opposite substrate 20, on which various layers have been formed as described above, are boned to each other via a sealing material, such that the orientation films 16 and 22 face each other. A liquid crystal containing two or more kinds of nematic liquid crystals is placed into the space between the two substrates by means of, for example, sucking, thereby forming a liquid crystal layer 50 with a predetermined thickness.

General Structure of Liquid Crystal Apparatus.

Figure 15:
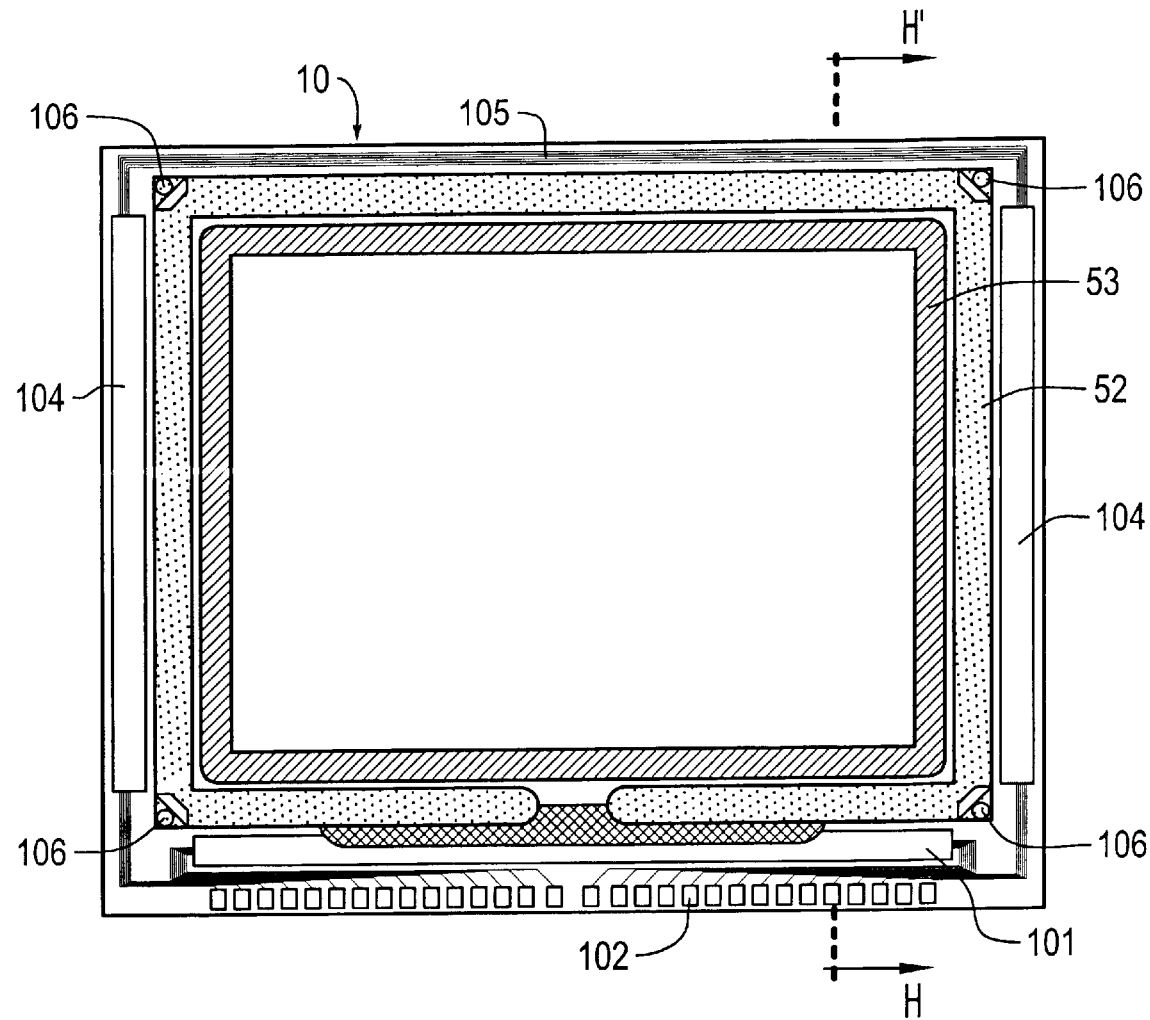
FIG. 15 is a plan view as viewed from the side of an opposite substrate, showing various elements formed on the TFT array substrate of the liquid crystal apparatus according to the embodiment of the invention.
Figure 16:
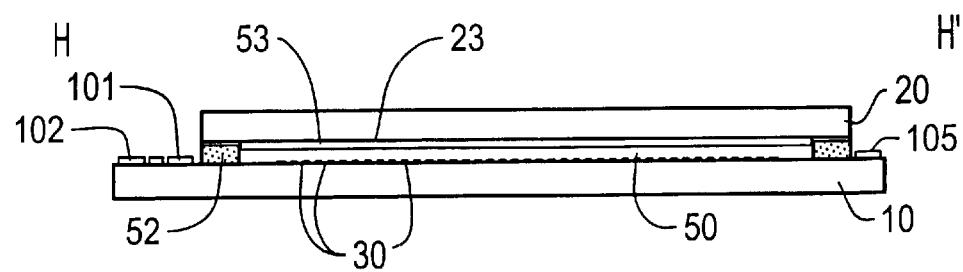
FIG. 16 is a cross-sectional view taken along plane H-H' of FIG. 15.

Referring first to FIGS. 15 and 16, the general structure of the liquid crystal apparatus is described below for various embodiments. FIG. 15 is a plan view as viewed from the side of an opposite substrate 20, wherein various elements formed on the TFT array substrate are shown. FIG. 16 is a cross-sectional view taken along plane H-H' of FIG. 16, wherein the opposite substrate is also shown.

As shown in FIG. 15, a sealing material 52 is disposed on a TFT array substrate 10 along the periphery thereof. A third light blocking film 53, serving as a peripheral partition made of the same material as that of the second light blocking film 23 or a different material, is disposed in an inner area along the sealing material 52. In an area outside the sealing material 52, a data line driving circuit 101 and external connection terminals 102 are disposed along one side of the TFT array substrate 10. Scanning line driving circuits 104 are disposed along two sides adjacent to the above-described side. In the case where a delay in the propagation of the scanning signal supplied to the scanning lines 3a is allowed, the scanning line driving circuit 104 may be disposed only on one side. The data line driving circuit 101 may be divided into two parts and they may be disposed at two sides of the image displaying area. For example, one data line driving circuit disposed along one side of the image display area may supply an image signal to odd-numbered data lines, and the other data line driving circuit disposed along the opposite side of the image displaying area may supply an image signal to even-numbered data lines. When the data lines 6a are driven in the comb fashion as described above, it is allowed to serial-parallel convert the area where the data line driving circuit 101 is formed, and thus it becomes possible to employ a complicated circuit. A plurality of wirings 105 extend along the remaining side on the TFT array substrate 10 so that the two scanning line driving circuits disposed at two sides of the image displaying area are connected to each other via the wirings 105. An upper-to-lower conducting element 106 is disposed at least at one corner of the opposite substrate 20 so that the TFT array substrate 10 and the opposite substrate 20 are electrically connected via the conducting element 106. As shown in FIG. 16, the opposite substrate 20 having an outer shape and size similar to those of the sealing material 52 shown in FIG. 15 is bonded to the TFT array substrate 10 via the sealing material 52.

On the TFT array substrate 10 of the liquid crystal apparatus according to any embodiments described above with reference FIGS. 1 to 16, there may be further provided a precharging circuit for writing a precharging signal with a particular voltage on the respective data lines 6a at a proper time before the image signal is written, thereby facilitating the process of writing the image signal on the data lines 6a. Furthermore, there may be provided a test circuit for testing the quality or detecting a defect in the liquid crystal apparatus during the production process or before shipment. A part of peripheral circuits, such as a data line driving circuit 101 and scanning line driving circuit 104, may be formed in a driving LSI mounted on a TAB (tape automated bonding substrate) and electrically and mechanically connected to the TFT array substrate 10 via an anisotropic conducting film. A polarizing film, a phase difference film, and/or a polarizing plate are properly disposed on the side of the opposite substrate 20 which is exposed to the projection light ray and also on the side of the TFT array substrate 10 from which the projection light ray emerges, depending on the operation mode such as an TN (twisted nematic) mode, or normally white mode/normally black mode.

When the above-described liquid crystal apparatus is used in a color liquid crystal projector, three similar liquid crystal apparatus are used as RGB light valves, respectively, wherein light rays with different colors created by passing a light ray through RGB color separation dichroic mirrors are passed through the respective liquid crystal apparatus. Therefore, in the embodiment of the invention, no color filter is disposed on the opposite substrate 20. However, an RGB color filter with a protective film may also be formed on the opposite substrate 20, in proper areas corresponding to the pixel electrodes 9a where the second light blocking film 23 is not formed. This allows the liquid crystal apparatus according to the present embodiment to be employed in a color liquid crystal apparatus of a type other than the liquid crystal projector, such as a direct-view-type or reflection-type color liquid crystal television set. Furthermore, micro lenses may be formed on the opposite substrate 20, at locations corresponding to the respective pixels so that the incident light is focused in a more efficient fashion, thereby achieving a brighter liquid crystal apparatus. Still furthermore, an interference film that includes a larger number of layers with different refractive index may be deposited on the opposite substrate 20, thereby forming a dichroic filter for producing an RGB color utilizing interference of light. By adding the dichroic filter to the opposite substrate, a still brighter color liquid crystal apparatus can be achieved.

Although in the above-described embodiments, light is incident on the liquid crystal apparatus from the opposite substrate side as in the conventional liquid crystal apparatus, light may be incident on the apparatus from the side of the TFT array substrate 10 and may emerge from the side of the opposite substrate 20 without causing a problem, because the first light blocking film 11a is provided. That is, when the liquid crystal apparatus is mounted on a liquid crystal projector, the channel region 1a' and the lightly doped source regions 1b and the lightly doped drain regions 1c of the semiconductor layer 1a are protected from illumination of light, and thus it is possible to display a high-quality image. In the conventional technique, to prevent light from being reflected at the back surface of the TFT array substrate 10, it is required to place an additional polarizing plate coated with an anti-reflection film at an outer location or it is required to bond an anti-reflection film to the TFT array substrate 10. In contrast, in the embodiments of the invention, the first light blocking film 11a is formed between the surface of the TFT array substrate 10 and the semiconductor layer 1a at least at locations corresponding to the channel region 1a' and the lightly doped source regions 1b and the lightly doped drain regions 1c. This makes it unnecessary to use an anti-reflection film or a polarizing plate with an anti-reflection film, or it becomes unnecessary to perform an anti-reflection process on the TFT array substrate 10 itself. Thus, according to the embodiments, it is possible to reduce the material cost. Furthermore, because the polarizing plate is not required, no reduction in the production yield due to dust or defects occurs during the process of bonding a polarizing plate. Still furthermore, the excellent light blocking property makes it possible to employ a bright light source or a polarizing beam splitter for achieving an improved light usage efficiency without causing degradation in the image quality, such as light crosstalk.

In the embodiments, the switching elements of the respective pixels are each formed into the structure of a normal stagger type or coplanar type polysilicon TFT. Alternatively, other types of TFTs, such as a reverse stagger type TFT or an amorphous silicon TFT, may also be employed.

Electronic Apparatus

Examples of electronic apparatus including the electrooptical apparatus are described below with reference to FIGS. 17–19.

Figure 17:
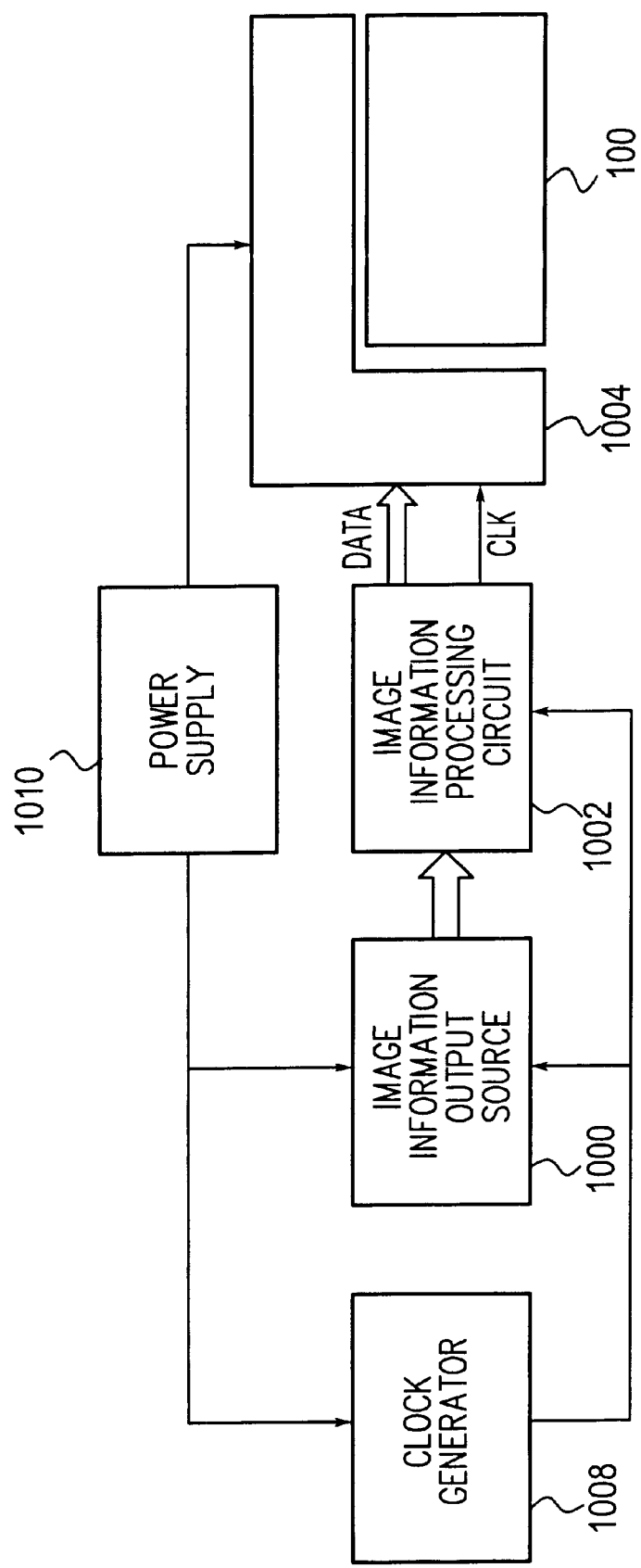
FIG. 17 is a block diagram illustrating a general structure of an electronic device according to an embodiment of the invention.

FIG. 17 illustrates the general structure of an electronic apparatus including a liquid crystal apparatus 100 as an example of an electrooptical apparatus.

As shown in FIG. 17, the electronic apparatus includes an image information output source 1000, an image information processing circuit 1002, a driving circuit 1004, a liquid crystal apparatus 100, a clock generator 1008, and a power supply 1010. The image information output source 1000 includes a memory, such as a ROM (read only memory), a RAM (random access memory), or an optical disk and a tuning circuit that tunes an image signal and outputs the resultant image signal. In response to the clock signal supplied from the clock generator 1008, the image information output source 1000 outputs image information, such as an image signal, to the image information processing circuit 1002. The image information processing circuit 1002 includes various processing circuits such as an inverting amplifier, a serial-parallel converter, a rotation circuit, a gamma correction circuit, and a clamping circuit, which are all known in the art. The image information processing circuit 1002 successively generates a digital signal from the image information input in response to the clock signal, and outputs the resultant digital signal together with a clock signal CLK to the driving circuit 1004. The driving circuit 1004 drives the liquid crystal apparatus 100. The power supply 1010 supplies electric power to the various circuits described above. The driving circuit 1004 may be mounted on the TFT array substrate of the liquid crystal panel 100. In addition, the image information processing circuit 1002 may also be mounted on the TFT array substrate.

Specific examples of electronic devices are described below with reference to FIGS. 18–19.

Figure 18:
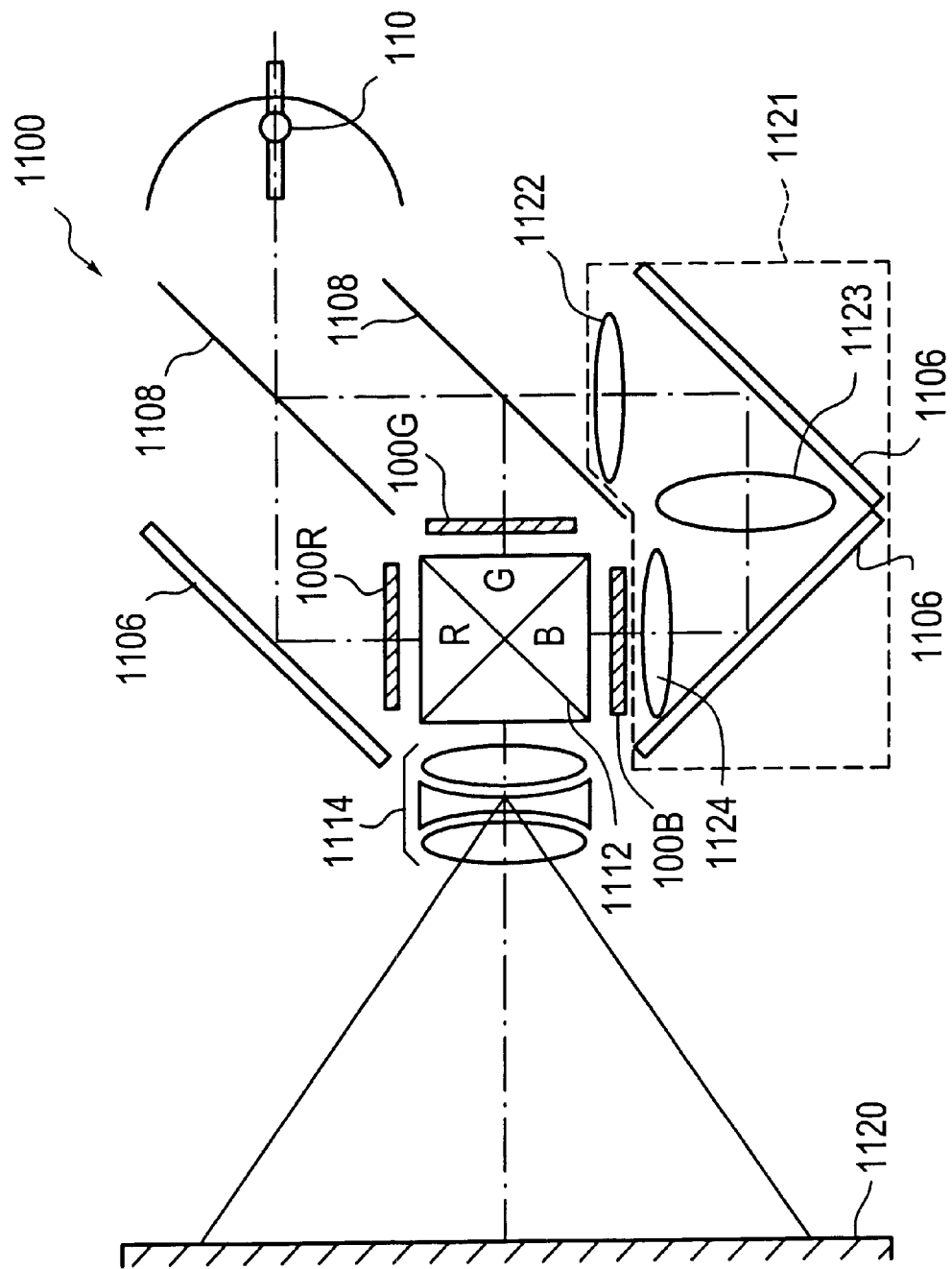
FIG. 18 is a cross-sectional view illustrating a liquid crystal projector which is an example of an electronic device.

FIG. 18 illustrates a liquid crystal projector 1100, which is an example of an electronic device. This liquid crystal projector 1100 includes three liquid crystal display modules, each including a liquid crystal apparatus 100 provided with a driving circuit 1004 of the above-described type formed on a TFT array substrate, wherein those three liquid crystal display modules are used as light valves 100R, 100G, and 100B for R, G, and B colors, respectively. In this liquid crystal projector 1100, a projection light ray is emitted from a white light source, such as a metal halide lamp serving as a lamp unit 110. The light ray is divided by three mirrors 1106 and two dichroic mirrors 1108 into three light components R, G, B with three primary colors RGB. The three light components are then passed through the light valves 100R, 100G, and 100B, respectively. In the above process, in order to prevent the blue light ray B from having a transmission loss caused by a long optical path, the blue light ray B is transmitted via the relay lens system 1121 including an incident lens 1122, a relay lens 1123, and an emerging lens 1124. The light rays with three primary colors are separately modulated by the three light valves 100R, 100G, and 100B, respectively, and mixed into a single ray through a dichroic prism 1112. The resultant light ray is projected onto a screen 1120 via the projection lens 1114, and thus a color image is formed thereon.

Figure 19:
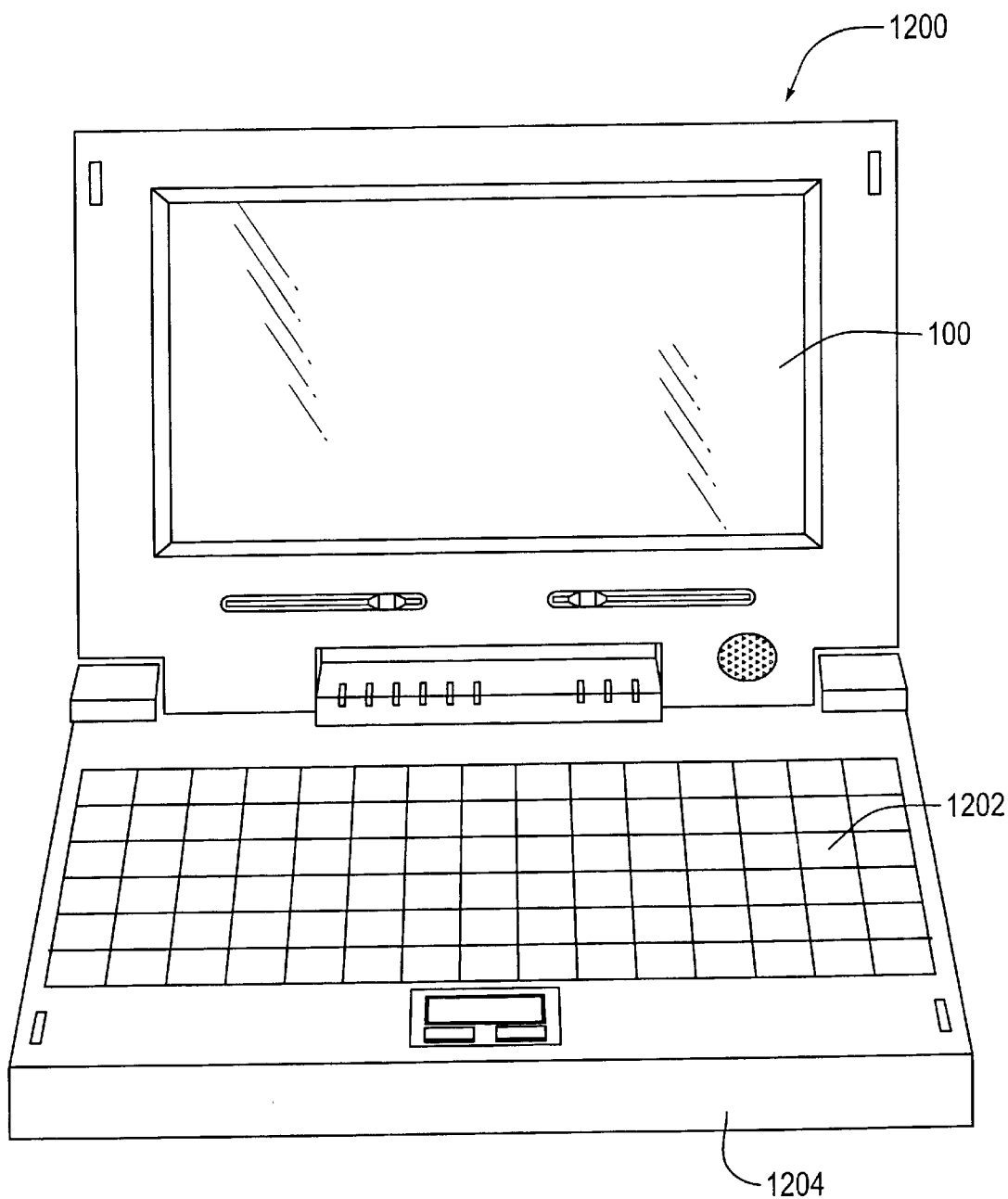
FIG. 19 is a front view illustrating a personal computer which is another example of an electronic device.

FIG. 19 illustrates another example of an electronic device, that is, a laptop personal computer (PC) 1200 capable of handing multi-media. The laptop personal computer 1200 includes a liquid crystal apparatus 100 of the above-described type disposed on the inner side of a top cover case. The main body 1204 of the laptop personal computer 1200 includes a CPU, a memory, a modem, and a keyboard 1202.

In addition to the electronic devices described above with reference to FIGS. 18–19, there are other examples of the electronic device shown in FIG. 17. They include a liquid crystal television set, a video tape recorder with a viewfinder or a monitor display, a car navigation system, a pocket-sized electronic notebook, an electronic calculator, a word processor, an engineering workstation (EWS), a portable telephone, a video telephone, a POS terminal, and an apparatus with a touch panel.

According to the present embodiment, as described above, it is possible to realize various types of electronic apparatus provided within a liquid crystal apparatus capable of displaying a high-quality image, which can be produced in a highly efficient manner.

Advantages

In the electrooptical apparatus according to the present invention, since image signals and other signals are supplied via peripheral wirings, including a interconnecting line made of a light blocking film and having a low resistance, the capacitance lines does not have a significantly large voltage fluctuation, crosstalk, and ghost due to the capacitive coupling between the capacitance lines and other lines, such as image signal lines and interconnecting lines, even when the driving frequency of the electrooptical apparatus is increased. This allows the electrooptical apparatus to display a high-quality image. Another advantage of the electrooptical apparatus, in addition to the above advantage, is the redundant structure, whereby if a capacitance line is broken in the middle of the line due to dust or the like, a signal is still supplied via a light blocking film instead of the broken capacitance line. This makes it possible to easily achieve a high-reliability electrooptical apparatus.

What is claimed is:

1. An electrooptical apparatus, comprising:
    a pair of substrates;
    an electrooptical material disposed between the pair of substrates;
    a structure disposed on one of the pair of substrates, the structure including:
        a plurality of pixel electrodes arranged in a matrix fashion; a plurality of thin-film transistors that drive the plurality of pixel electrodes, each of the plurality of thin-film transistors having a channel region; a plurality of data lines connected to the plurality of thin-film transistors, and a plurality of scanning lines connected to said plurality of thin-film transistors, said plurality of data lines and said plurality of scanning lines crossing each other at different layer levels;
        an electrically-conductive light blocking film disposed such that at least the channel region of each of said plurality of thin-film transistors is covered with said light blocking film when viewed from the one of the pair of substrates;
    at least one peripheral circuit including peripheral wirings wherein the peripheral wirings include a first wiring having a first conductive film which also forms the light blocking film and a second wiring including at least one of conductive films constituting the thin-film transistors, the data lines and the scanning lines.

2. The electrooptical apparatus according to claim 1, the first wiring including the first conductive film and a second conductive film which is at least one of conductive films constituting the thin film transistors, the data lines and the scanning lines, and the second wiring include a third conductive film which is at least one of conductive films constituting the thin film transistors, the data lines, and the scanning lines and is different from the second conductive film.

3. The electrooptical apparatus according to claim 2, the second conductive film having a higher resistance than side first conductive film.

4. The electrooptical apparatus according to claim 2, further comprising:
    a first interlayer insulating film disposed between said first conductive film and said thin-film transistors; and
    a second interlayer insulating film disposed between said third conductive film and said second conductive film;
    wherein said first wiring includes a interconnecting line which is electrically connected to a part of said second wiring and which crosses another part of said second wiring via at least one of said first interlayer insulating film and the second interlayer insulating film.

5. The electrooptical apparatus according to claim 4,
    said peripheral wirings including an image signal line that supplies said image signal from an external input terminal; and
    said peripheral circuit includes a sampling circuit that samples said image signal, a data line driving circuit that drives said sampling circuit with predetermined timing thereby supplying said image signal on said image signal line to said plurality of data lines via said sampling circuit, and a scanning line driving circuit that drives said scanning lines.

6. The electrooptical apparatus according to claim 5,
    said image signal being serial-parallel converted to N phases (N being an integer of at least 2) and there are provided N image signal lines; and
    said N image signal lines including a interconnecting line at a location where some of said N image signal lines cross each other.

7. The electrooptical apparatus according to claim 5, further comprising a plurality of sampling circuit driving signal lines that supply a sampling circuit driving signal from said data line driving circuit to said sampling circuit,
    at least a part of said sampling circuit driving signal lines which cross any of said image signal lines being made of said interconnecting line.

8. The electrooptical apparatus according to claim 2, said second conductive film and said first conductive film both forming said first wiring being electrically connected to each other via a contact hole formed in said first interlayer insulating film.

9. The electrooptical apparatus according to claim 2, said third conductive film being made of a thin metal film forming said data lines connected to at least one of a source and a drain of said thin-film transistors; and
    said second conductive film being made of a thin polysilicon film forming said scanning lines including gate electrodes of said thin-film transistors.

10. The electrooptical apparatus according to claim 2, further comprising a sealing material that encloses said electrooptical material between said pair of substrates,
    wherein at least three films including said third conductive film, said second conductive film, and said first conductive film are disposed in a multilayer fashion in a sealing area, in contact with said sealing material, on said one of the pair of substrates, around a periphery of said electrooptical material, and leading wirings of said data lines and scanning lines extending across said sealing area are formed of at least one of said at least three films.

11. The electrooptical apparatus according to claim 10, said leading wirings each including at least one of a two-layer wiring and a three-layer wiring having layers that are made of at least two of said at least three films, respectively, said layers being electrically connected to each other via a contact hole.

12. The electrooptical apparatus according to claim 10, said leading wirings each including a single-layer wiring made of one of said at least three films, the other two films of said at least three films being dummy wirings which do not serve as an wiring in said sealing region.

13. The electrooptical apparatus according to claim 2, said first wiring being formed such that a part made of the first conductive film is covered with a part made of the second conductive film when viewed from the other one of said pair of substrates.

14. The electrooptical apparatus according to claim 13, wherein in said first wiring, the part made of the third conductive film has an wiring width smaller than the part made of the second conductive film.

15. An electronic apparatus including the electrooptical apparatus of claim 1.

16. The electrooptical apparatus according to claim 1, wherein the electrically-conductive light blocking film is formed between the one of the pair of the substrates and the thin-film transistors.

17. An electrooptical apparatus, comprising:
a pair of substrates;
an electrooptical material disposed between the pair of substrates;
a structure disposed on one of the pair of substrates, the structure including:
a plurality of scanning lines;
a plurality of data lines;
thin-film transistors connected to the plurality of scanning lines and to the plurality of data lines, each of the thin-film transistors having a channel region;
pixel electrodes connected to said thin-film transistors;
an electrically-conductive light blocking film disposed such that at least the channel region of each of said thin-film transistors is covered with said light blocking film when viewed from the one of the pair of substrates;
a plurality of image signal lines that supply an image signal;
a sampling circuit that samples said image signal supplied via said plurality of image signal lines and supplies the resultant signals to said plurality of data lines; and
interconnecting lines connecting said image signal lines to said sampling circuit, a part of each of the interconnecting lines being made of said light blocking film.

18. The electrooptical apparatus according to claim 17, at least a part of sampling circuit driving signal lines that supply a sampling circuit driving signal to said sampling circuit being made of said light blocking film.

19. An electronic apparatus including the electrooptical apparatus of claim 17.

20. A method of producing an electrooptical apparatus that includes an electrooptical material disposed between a pair of substrates wherein, on one of the pair of substrates, there are provided: a plurality of scanning lines; a plurality of data lines; thin-film transistors connected to the plurality of scanning lines and to the plurality of data lines; pixel electrodes connected to the thin-film transistors; an electrically-conductive light blocking film disposed such that at least a channel region of each of said thin-film transistors is covered with said light blocking film when viewed from the one of the pair of substrates; a plurality of image signal lines that supply an image signal; and a sampling circuit that samples said image signals supplied via the plurality of image signal lines and supplies the resultant signals to the plurality of data lines; said method comprising the steps of:

forming said light blocking film and first interconnecting lines that connect said image signal lines to said sampling circuit using the same material;

forming a first interlayer insulating film on said first interconnecting lines and said light blocking film;

forming said scanning lines on said first interlayer insulating film and also forming a second interconnecting line connected to said first interconnecting line via a contact hole formed in said first interlayer insulating film;

forming a second interlayer insulating film on said scanning lines and said second interconnecting line; and forming said data lines connected to said thin-film transistors via contact holes formed in said second interlayer insulating film and also forming said image signal lines connected to said second interconnecting lines.

21. A method of producing an electrooptical apparatus that includes an electrooptical material disposed between a pair of substrates wherein, on one of the pair of substrates, there are provided: a plurality of scanning lines; a plurality of data lines; thin-film transistors connected to the plurality of scanning lines and to the plurality of data lines; pixel electrodes connected to the thin-film transistors; an electrically-conductive light blocking film disposed such that at least a channel region of each of said thin-film transistors is covered with said light blocking film when viewed from the one of the pair of substrates; a plurality of image signal lines that supply an image signal; and a sampling circuit that samples said image signals supplied via the plurality of image signal lines and supplies the resultant signals to the plurality of data lines; said method comprising the steps of:

forming said light blocking film and first interconnecting lines that connect said image signal lines to said sampling circuit using the same material;

forming a first interlayer insulating film on said first interconnecting lines and said light blocking film;

successively forming a plurality of films into a multilayer structure on said first interlayer insulating film, said plurality of films including a semiconductor layer acting as a source and drain of each of said thin-film transistors, a gate insulating film, and a gate electrode;

forming a second interlayer insulating film on said gate electrode; and forming said data lines connected to said thin-film transistors via contact holes formed in said second interlayer insulating film and also forming signal lines connected to said first interconnecting lines via contact holes formed in said first and second interlayer insulating films.

* * * * *